United States Patent
Sugahara

(10) Patent No.: US 7,449,816 B2
(45) Date of Patent: Nov. 11, 2008

(54) PIEZOELECTRIC ACTUATOR, LIQUID TRANSPORTING APPARATUS, AND METHOD FOR PRODUCING PIEZOELECTRIC ACTUATOR AND METHOD FOR PRODUCING LIQUID TRANSPORTING APPARATUS

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 214 days.

(21) Appl. No.: 11/389,159

(22) Filed: Mar. 27, 2006

(65) Prior Publication Data

US 2006/0244343 A1 Nov. 2, 2006

(30) Foreign Application Priority Data

Mar. 25, 2005 (JP) .............................. 2005-089100

(51) Int. Cl.
*H01L 41/08* (2006.01)
(52) U.S. Cl. ....................................... 310/324; 310/331
(58) Field of Classification Search ......... 310/330–331, 310/328
See application file for complete search history.

(56) References Cited

U.S. PATENT DOCUMENTS

| | | | | |
|---|---|---|---|---|
| 5,872,583 | A * | 2/1999 | Yamamoto et al. | 347/70 |
| 6,584,660 | B1 * | 7/2003 | Shimogawa et al. | 29/25.35 |
| 6,796,638 | B2 * | 9/2004 | Koike et al. | 347/70 |
| 6,891,314 | B2 | 5/2005 | Sato et al. | |
| 7,018,024 | B2 * | 3/2006 | Koike et al. | 347/71 |
| 7,053,526 | B2 * | 5/2006 | Unno et al. | 310/324 |
| 7,084,551 | B2 * | 8/2006 | Yoshimura et al. | 310/324 |
| 7,125,107 | B2 * | 10/2006 | Satake et al. | 347/68 |
| 7,229,161 | B2 * | 6/2007 | Satake | 347/71 |
| 2006/0023436 | A1 | 2/2006 | Sugahara | |

FOREIGN PATENT DOCUMENTS

JP 2003 69103 3/2003

* cited by examiner

*Primary Examiner*—Mark Budd
(74) *Attorney, Agent, or Firm*—Baker Botts L.L.P.

(57) ABSTRACT

A liquid transporting apparatus includes individual electrodes 32, wirings 35 having contact points 35a respectively, FPC 40 having terminals 42a, a cavity plate 10, and individual cooling passages 47 formed in the cavity plate 10. Each of the individual cooling passages 47 is formed at a position which is between one of the individual electrodes 32 and one of the contact points 35a and which faces one of the wirings 35. When the FPC 40 and the wirings 35 are joined, a conductive material 45 between the terminals 42a of the FPC 40 and the contact points 35a of the wirings 35 are melted while a cooling liquid 60 is being flowed in the individual cooling passages 47, thereby cooling the molten conductive material 45. Thus, it is possible to suppress the flowing of conductive material 45 from the contact points 35a to their surroundings.

19 Claims, 18 Drawing Sheets

PIEZOELECTRIC ACTUATOR, LIQUID TRANSPORTING APPARATUS, AND METHOD FOR PRODUCING PIEZOELECTRIC ACTUATOR AND METHOD FOR PRODUCING LIQUID TRANSPORTING APPARATUS

FIELD OF THE INVENTION

The present invention relates to a piezoelectric actuator, a liquid transporting apparatus provided with a piezoelectric actuator, and a method for producing a piezoelectric actuator and a method for producing a liquid transporting apparatus.

BACKGROUND OF THE INVENTION

Piezoelectric actuators, which drive an object by utilizing the deformation of a piezoelectric material when electric field acts thereon, have been hitherto used widely in various fields. For example, U.S. Pat. No. 6,891,314 B2 (corresponding to Japanese Patent Application Laid-open No. 2003-69103) shows in FIGS. 1 to 3 an ink-jet head provided with a piezoelectric actuator which applies discharge pressure to ink. The piezoelectric actuator includes a metallic substrate supported by rigid components, a plurality of piezoelectric elements (piezoelectric layers) arranged on the substrate, signal electrodes each of which is formed in upper surface of one of the piezoelectric elements, and common electrodes each of which is formed in the lower surface of one of the piezoelectric elements. Each of the piezoelectric elements has a deformation area (actuator area) at which the substrate is not joined or bonded to one of the rigid components and a joining area (area for electric connection) at which the substrate is joined to one of the rigid components. In each of the piezoelectric elements, the signal electrode is extended from the deformation area to the joining area, at which the signal electrode is electrically connected to a flexible print circuit (FPC) board formed of a flexible resin base material. Driving signal is supplied to each of the signal electrodes via this FPC.

Here, in the surface of the FPC on the side of (facing) the piezoelectric elements, terminals are formed to correspond to the signal electrodes respectively. Each of the terminals has a core and a semi-spherical bump which covers the core and which is made of electrically conductive joining material. The process for connecting the FPC to the signal electrodes involves positioning each of the bumps of the FPC and the portion of associated signal electrode, the portion being extended to the joining area of the signal electrode. In this state, the bumps are heated to melt the joining material, thereby joining, with the molten joining material, the signal electrodes and the terminals of FPC respectively.

In the piezoelectric actuator described in U.S. Pat. No. 6,891,314 B2, when the joining material is melted to join the signal electrodes and the terminals of the FPC, a portion of the molten joining material flows out to the surroundings. At this time, when the joining material flows along the signal electrode up to the deformation area of the associated piezoelectric element, then the deformation of the piezoelectric element at its deformation area is hindered by the joining material, which results in preventing the normal operation of the piezoelectric actuator. In addition, there is a feat that the molten conductive joining material flows from a certain signal electrode to another signal electrode adjacent to this signal electrode, causing a short circuit between the two signal electrodes.

SUMMARY OF THE INVENTION

An object of the present invention is to suppress the flowing of the molten conductive material out to the surroundings when an electrode in the surface of a piezoelectric layer is joined to a wiring member with a conductive material.

According to a first aspect of the present invention, there is provided a piezoelectric actuator including: a vibration plate; a supporting member having a non-interference portion which does not interfere with deformation of the vibration plate, and a joining portion joined to the vibration plate; a piezoelectric layer arranged on a side of the vibration plate opposite to the supporting member; a first electrode arranged on a surface of the piezoelectric layer on a side of the vibration plate; a second electrode arranged at an area facing the non-interference portion, the area being on a surface of the piezoelectric layer on a side opposite to the vibration plate; a wiring which has a contact point and which extends, on the surface of the piezoelectric layer on the side opposite to the vibration plate, from the second electrode to an area facing the joining portion; and a wiring member which has a terminal joined, with an electrically conductive material, to the contact point of the wiring, and which supplies drive voltage to the second electrode; wherein a cavity is provided at a portion of at least one of the vibration plate and the joining portion, the portion facing the wiring and being disposed between the second electrode and the contact point.

In the piezoelectric actuator of the present invention, the cavity may a hole through which a coolant flows when the wiring and the terminal are joined with the conductive material, and the coolant may be liquid or gas.

According to the first aspect of the present invention, when drive voltage is supplied to the second electrode via the wiring member, an electric field acts in the piezoelectric layer at a portion between the first and second electrodes and facing the non-interference portion. Then, the electric field deforms the portion of the piezoelectric layer, which results in deforming a portion of the vibration plate facing the non-interference portion. The deformation of the portion of the vibration plate drives or actuates an object. The contact point of the wiring connected to the second electrode and the terminal of the wiring member are joined with the conductive material. The joining involves melting the conductive material. There is a fear that a portion of the molten material flows from the contact point along the wiring up to the surface of the second electrode. In the present invention, however, a cavity is provided at a portion of at least one of the vibration plate and the joining portion, the portion facing the wiring and being disposed between the second electrode and the contact point. Accordingly, the conductive material, flowing from the contact point toward the second electrode, is cooled by the cavity or coolant such as cooling liquid which is filled into the cavity, and consequently the viscosity of the conductive material is increased at an intermediate position of the wiring along which the conductive material flows. Therefore, the conductive material starts to solidify at this intermediate position and thus cannot flow further. Accordingly, it is possible to prevent the conductive material from sticking or adhering to the surface of the second electrode and prevent the adhered conductive material from inhibiting the deformation of the piezoelectric layer. The present invention includes not only an aspect according to which the vibration plate and the first electrode are constructed of separate members but also an aspect according to which the vibration plate is electrically conductive, and a surface of this conductive vibration plate that is opposite to the non-interference portion serves as the first electrode.

In the piezoelectric actuator of the present invention, the non-interference portion may be formed as a plurality of non-interference portions which are arranged adjacently to each other along a plane; the second electrode may be formed as a plurality of second electrodes corresponding to the non-interference portions respectively; and the cavity may be provided as a plurality of cavities which are communicated with each other and each of which corresponds to one of the second electrodes. When the plurality of cavities communicate with each other, it is easy for the coolant such as cooling liquid to flow between the cavities. This makes it possible to cool the molten conductive material more effectively.

In the piezoelectric actuator of the present invention, each of the cavities may extend to an area facing a portion between contact points of wirings which correspond to second electrodes which are included in the plurality of second electrodes and which are adjacent to each other. In this case, the conductive material flowing from a contact point of a certain wiring to a contact point of another wiring adjacent to this wiring is cooled by the coolant such as cooling liquid in the cavity formed at an area between the two contact points. Accordingly, it is possible to prevent the occurrence of short circuit between two adjacent wirings assuredly.

In the piezoelectric actuator of the present invention, the cavity may be formed to have an annular shape to surround the contact point of the wiring. Thus, the cavity having the annular shape is capable of preventing the molten conductive material from flowing out from the contact point to its surroundings more reliably.

In the piezoelectric actuator of the present invention, the wiring may be partially narrowed at a portion thereof between the second electrode and the contact point. The narrow portion reduces the amount of conductive material flowing from the contact point along the wiring toward the second electrode, thereby preventing the conductive material from sticking to the surface of the second electrode more reliably.

According to a second aspect of the present invention, there is provided a piezoelectric actuator including: a vibration plate; a supporting member having a plurality of non-interference portions which do not interfere with deformation of the vibration plate, and joining portions joined to the vibration plate; a piezoelectric layer arranged on a surface of the vibration plate on a side opposite to the supporting member; a first electrode arranged on a surface of the piezoelectric layer on a side of the vibration plate; a plurality of second electrodes each of which is arranged at an area facing one of the non-interference portions, the area being on the surface of the piezoelectric layer on the side opposite to the vibration plate; a plurality of wirings each of which has a contact point and extends, on the surface of the piezoelectric layer on the side opposite to the vibration plate, from one of the second electrodes to an area facing one of the joining portions; a wiring member which has a plurality of terminals and which supplies drive voltage to the second electrodes, each of the terminals being joined, with an electrically conductive material, to the contact point of one of the wirings; wherein a plurality of cavities are provided at portions of at least one of the vibration plate and the joining portions, each of the portions facing a portion between contact points of wirings corresponding to second electrodes which are included in the plurality of second electrodes and which are adjacent to each other.

In the piezoelectric actuator of the present invention, each of the cavities may be a hole through which coolant flows when the wirings and the terminals are joined respectively with the conductive material, and the coolant may be liquid or gas.

According to the second aspect of the present invention, the conductive material flowing from a contact point of a certain wiring to a contact point of another wiring adjacent to this wiring is cooled by the cavities or by the coolant such as cooling liquid in the cavities each of which is formed at an area between the two contact points. Accordingly, it is possible to prevent the occurrence of short circuit between two adjacent wirings assuredly. The present invention also includes an aspect according to which the vibration plate is electrically conductive, and a surface of this conductive vibration plate that is opposite to the pressure chambers serves as the first electrode.

According to a third aspect of the present invention, there is provided a liquid transporting apparatus including a liquid channel which has a plurality of pressure chambers arranged along a plane, and a piezoelectric actuator which changes volume of the pressure chambers to apply pressure to a liquid in the pressure chambers, wherein the piezoelectric actuator includes: a pressure chamber plate in which the pressure chambers are formed; a vibration plate which is joined to the pressure chamber plate at joining portions of the pressure chamber plate to cover the pressure chambers; a piezoelectric layer arranged on a side of the vibration plate opposite to the pressure chamber plate; a common electrode arranged on a surface of the piezoelectric layer on a side of the vibration plate; a plurality of individual electrodes each of which is arranged at an area on a surface of the piezoelectric layer on a side opposite to the vibration plate, the area facing one of the pressure chambers; a plurality of wirings each of which has a contact point and each of which extends, on the surface of the piezoelectric layer on the side opposite to the vibration plate, to an area facing one of the joining portions; a wiring member which supplies drive voltage to the individual electrodes and which has a plurality of terminals, each of the terminals being joined to the contact point of one of the wirings with an electrically conductive material; wherein cavities are provided at portions of at least one of the vibration plate and the joining portions, each of the portions facing one of the wirings and being disposed between one of the individual electrodes and the contact point of one of the wirings.

In the liquid transporting apparatus of the present invention, each of the cavities may a hole through which coolant flows when the wirings and the terminals are joined respectively with the conductive material, and the coolant may be liquid or gas.

According to the third aspect of the present invention, when drive voltage is supplied via the wiring member selectively to the plurality of individual electrodes, an electric field acts in the piezoelectric layer at a portion between the common electrode and an individual electrode of the individual electrodes to which the voltage is applied. The electric field deforms the piezoelectric layer, consequently deforming the vibration plate to apply pressure to the liquid in the pressure chamber. In this case, since each of the contact points of the wirings which are connected to the individual electrodes are joined to one of the terminals of the wiring members with the conductive material, when the conductive material is melt, a portion of the molten conductive material flows from the contact point along the wiring toward the individual electrode. However, the flowing conductive material is cooled by the cavities or coolant such as cooling liquid filled in the cavities, thereby preventing the conductive material from sticking to the surface of the individual electrode, and thus preventing the adhered conductive material from inhibiting the deformation of the piezoelectric layer. The present invention includes an aspect according to which the vibration plate is electrically conductive, and a surface of this conductive vibration plate that is opposite to the pressure chambers serves as the common electrode.

According to a fourth aspect of the present invention, there is provided a method for producing the piezoelectric actuator, the method including: a filling step of filling cooling liquid into the cavity; and a joining step of heating the conductive material, and joining the wiring and the terminal with the molten conductive material. The conductive material melt in the joining step flows from the contact point along the wiring toward the second electrode. While flowing along the wiring, the molten material is cooled at an intermediate position in the wiring by the cooling liquid filled in the cavity and thus cannot flow further. This prevents the conductive material from sticking to the second electrode.

In the method for producing the piezoelectric actuator of the present invention, the cooling liquid may be mainly composed of water. Since the cooling liquid is mainly composed of water which is cheap and high in specific heat, it is possible to cool the molten conductive material effectively while lowering the manufacturing costs.

In the method for producing the piezoelectric actuator of the present invention, the cooling liquid filled into the cavity may be forcibly flowed. By forcibly flowing the cooling liquid, it is possible to further improve the cooling effect of the cooling liquid on the conductive material.

According to a fifth aspect of the present invention, there is provided a method for producing a liquid transporting apparatus, the apparatus including:

a channel unit having a plurality of pressure chambers arranged along a plane;

a piezoelectric actuator having: a vibration plate which is joined to the channel unit at joining portions of the channel unit to cover the pressure chambers; a piezoelectric layer arranged on a side of the vibration plate opposite to the pressure chambers; a common electrode arranged on a surface of the piezoelectric layer on a side of the vibration plate; a plurality of individual electrodes each of which is arranged at an area facing one of the pressure chambers, the area being on a surface of the piezoelectric layer on a side opposite to the vibration plate; a plurality of wirings each of which extends, on the surface of the piezoelectric layer on the side opposite to the vibration plate, from one of the individual electrodes to an area facing one of the joining portions; and a wiring member having a plurality of terminals each of which is joined to one of the wirings; and a coolant channel which is provided in the channel unit or the piezoelectric actuator and through which a coolant flows, the method including: a filling step of filling the coolant into the coolant channel; and a joining step of disposing an electrically conductive material between the wirings and the terminals, performing heating, and joining, with the molten conductive material, the wirings and the terminals respectively.

In the method for producing a liquid transporting apparatus of the present invention, the coolant channel may be a channel including the pressure chambers; and the coolant may be liquid.

According to the fifth aspect of the present invention, a portion of the conductive material melt in the joining step flows from the contact point along the associated wiring toward the associated individual electrode. In the present invention, however, the conductive material, flowing from the contact point toward the second electrode, is cooled by the coolant such as cooling liquid which is filled in the coolant channel. Consequently, the viscosity of the conductive material is increased at an intermediate position of the wiring along which the conductive material flows, the conductive material starts to solidify at the intermediate position and thus cannot flow further. Thus, it is possible to prevent the conductive material from adhering to the individual electrode. When the filling step is performed while filling the coolant into the channel through which the liquid as an objective transferred by the liquid transporting apparatus flows, there is no need to form a dedicated space or cavity to be filled with the cooling liquid separately. This is advantageous in terms of manufacturing costs. The liquid transporting apparatus, produced with this method of the present invention, includes an aspect according to which the vibration plate is electrically conductive, and the surface of this conductive vibration plate opposite to the pressure chambers serves as the common electrode.

BRIEF DESCRIPTION OF THE DRAWINGS

FIGS. 6A to 6C show a process for producing a piezoelectric actuator of the first embodiment, wherein FIG. 6A shows a step of joining a channel unit and a vibration plate together; FIG. 6B shows a step of forming a piezoelectric layer, an individual electrode and a wiring; and FIG. 6C shows a step of joining the wiring on the upper surface of the piezoelectric layer and a terminal of an FPC.

DETAILED DESCRIPTION OF PREFERRED EMBODIMENTS

A first embodiment of the present invention will be explained. This embodiment is an example in which the present invention is applied to an ink-jet head, as a liquid transporting apparatus, which discharges ink through its nozzles onto recording paper.

Figure 1:
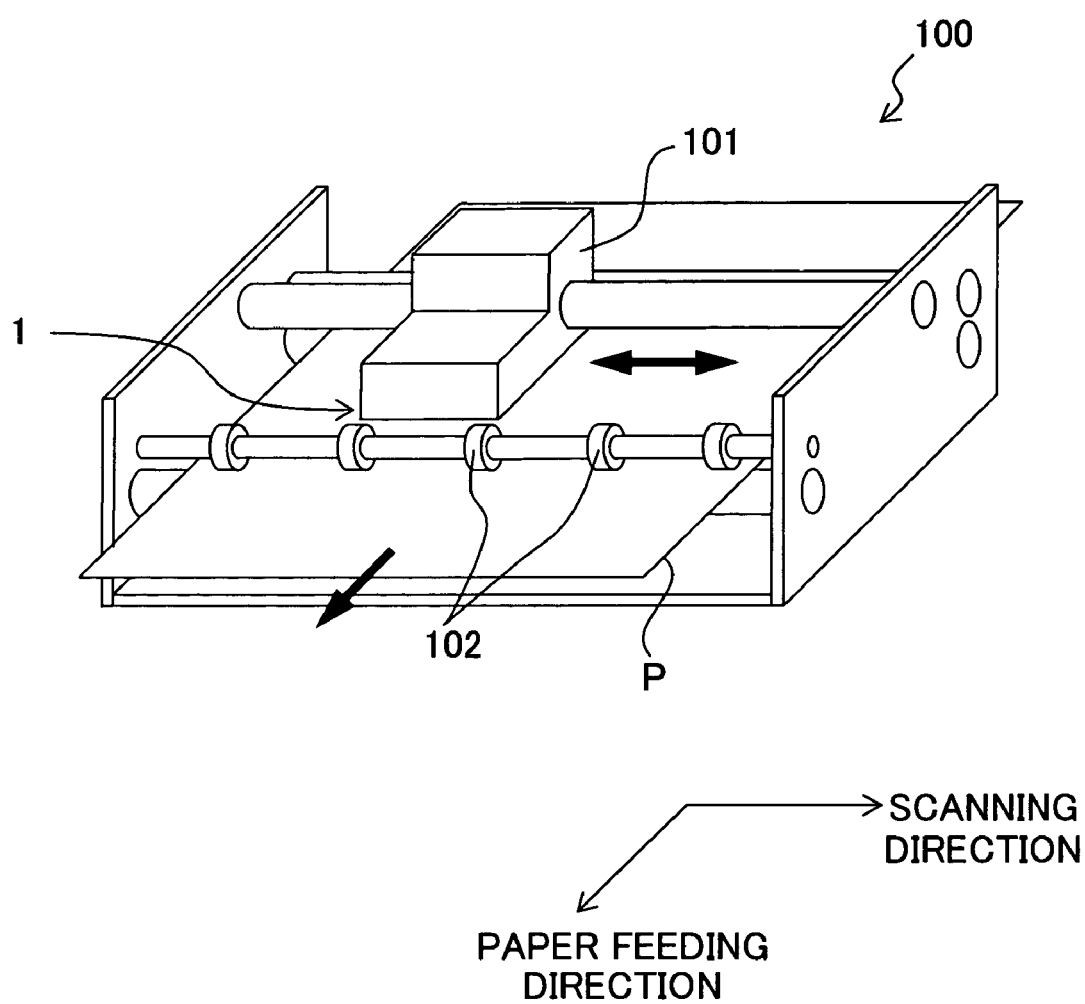
FIG. 1 is a schematic perspective view of an ink-jet printer according to a first embodiment of the present invention.

First, an ink-jet printer 100 which includes an ink-jet head 1 will be described briefly. As shown in FIG. 1, the ink-jet printer 1 includes a carriage 101 which is movable in a left and right direction FIG. 1, the ink-jet head 1 of serial type which is provided on the carriage 101 and discharges ink onto a recording paper P, and transporting rollers 102 which feed the recording paper P in a forward direction. The ink-jet head 1 moves integrally with the carriage 101 in the left and right direction (scanning direction) and discharges ink onto the recording paper P from ejecting ports of nozzles 20 (see FIG. 4) formed in an ink discharge surface of the lower surface of the ink-jet head 1. The recording paper P, with an image recorded thereon by the ink-jet head 1, is discharged in forward direction (paper feeding direction) by the transporting rollers 102.

Next, the ink-jet head 1 will be explained in detail with reference to FIGS. 2 to 5. As shown in FIGS. 2 to 5, the ink-jet head 1 includes a channel unit 2 in which a plurality of individual ink channels 21 (see FIG. 4) each including a pressure chamber 14 are formed, and a piezoelectric actuator 3 which is arranged on the upper surface of the channel unit 2.

Figure 4:
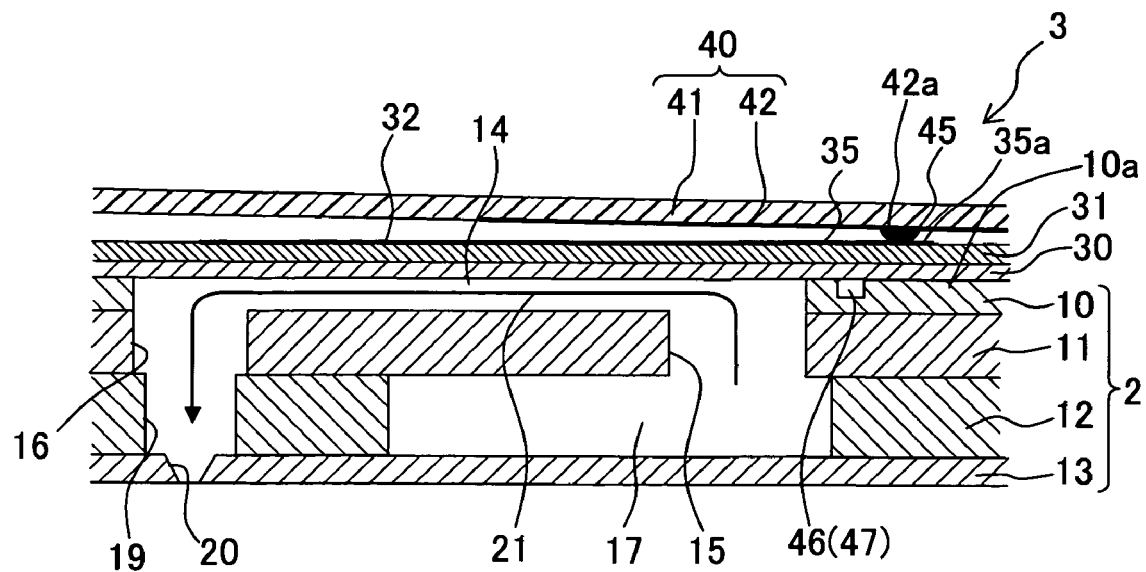
FIG. 4 is a sectional view taken on line IV-IV in FIG. 3.
Figure 5:
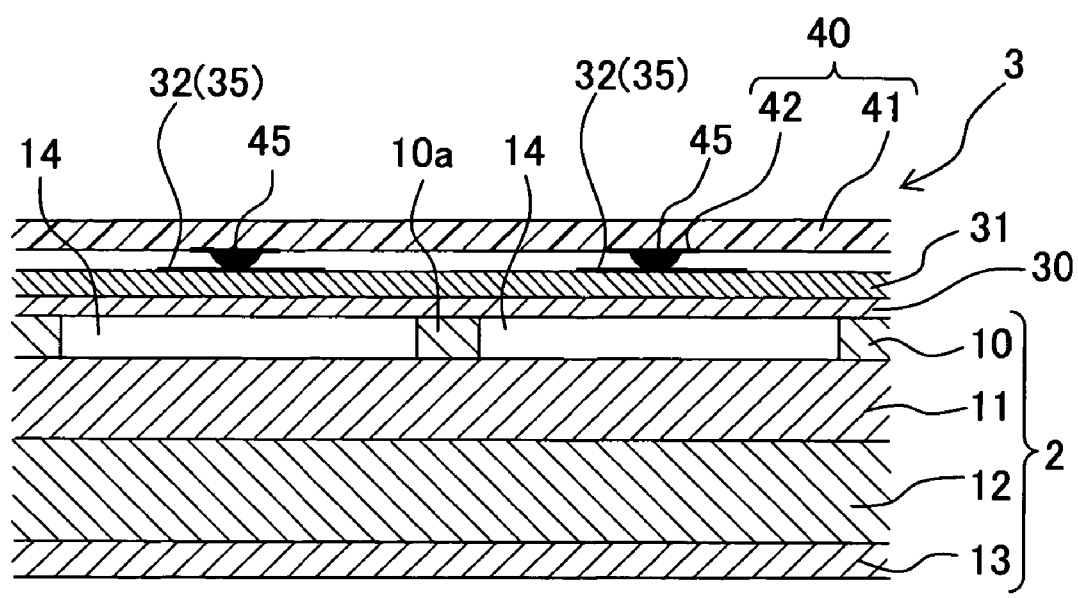
FIG. 5 is a sectional view taken on line V-V in FIG. 3.

First, the channel unit 2 will be explained below. As shown in FIGS. 4 and 5, the channel unit 2 includes a cavity plate 10, a base plate 11, a manifold plate 12, and a nozzle plate 13, and these four plates 10 to 13 are joined together in a state of stacked (laminated) layers. Among these plates, the cavity plate 10, the base plate 11, and the manifold plate 12 are stainless steel plates, and ink channels such as a manifold 17 and pressure chambers 14 (to be described later on) can be easily formed on these plate by means of etching. The nozzle plate 13 is formed of a high-molecular synthetic resin material such as polyimide and is joined to the lower surface of the manifold plate 12. Alternatively, this nozzle plate 13 may be formed of a metallic material such as stainless steel similar to the three plates 10 to 12.

As shown in FIGS. 2 to 5, in the cavity plate (pressure chamber plate) 10, a plurality of pressure chambers 14 are formed along a plane and aligned adjacently to each other. These pressure chambers 14 are partitioned by column portions 10a, and are open upward. The pressure chambers 14 are aligned in two rows in the paper feeding direction (up and down direction in FIG. 2). Each of the pressure chambers 14 is formed to have a shape substantially elliptical which is long in the scanning direction (left and right direction in FIG. 2) in a plan view.

Figure 2:
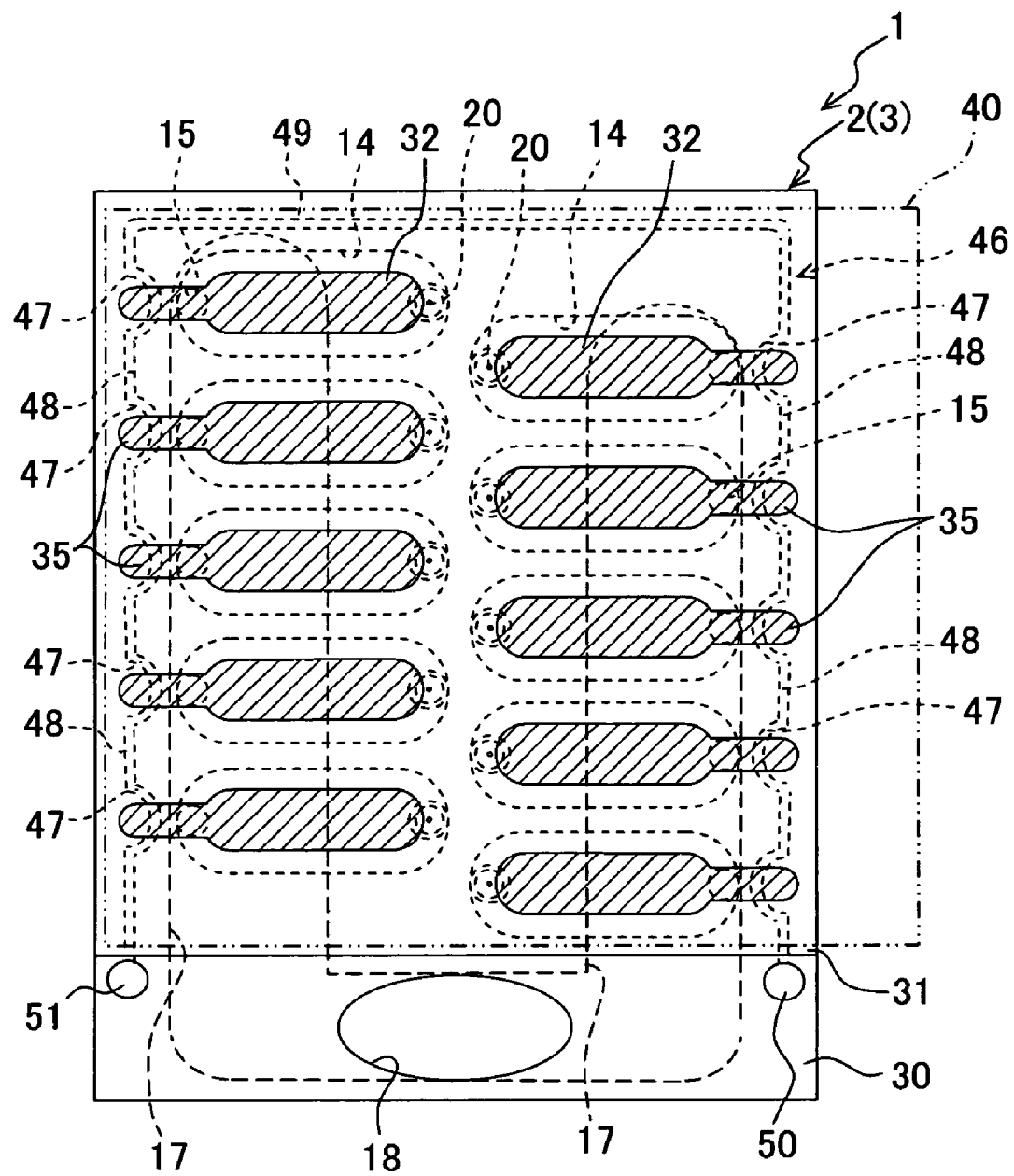
FIG. 2 is a plan view of an ink-jet head of the first embodiment.
Figure 3:
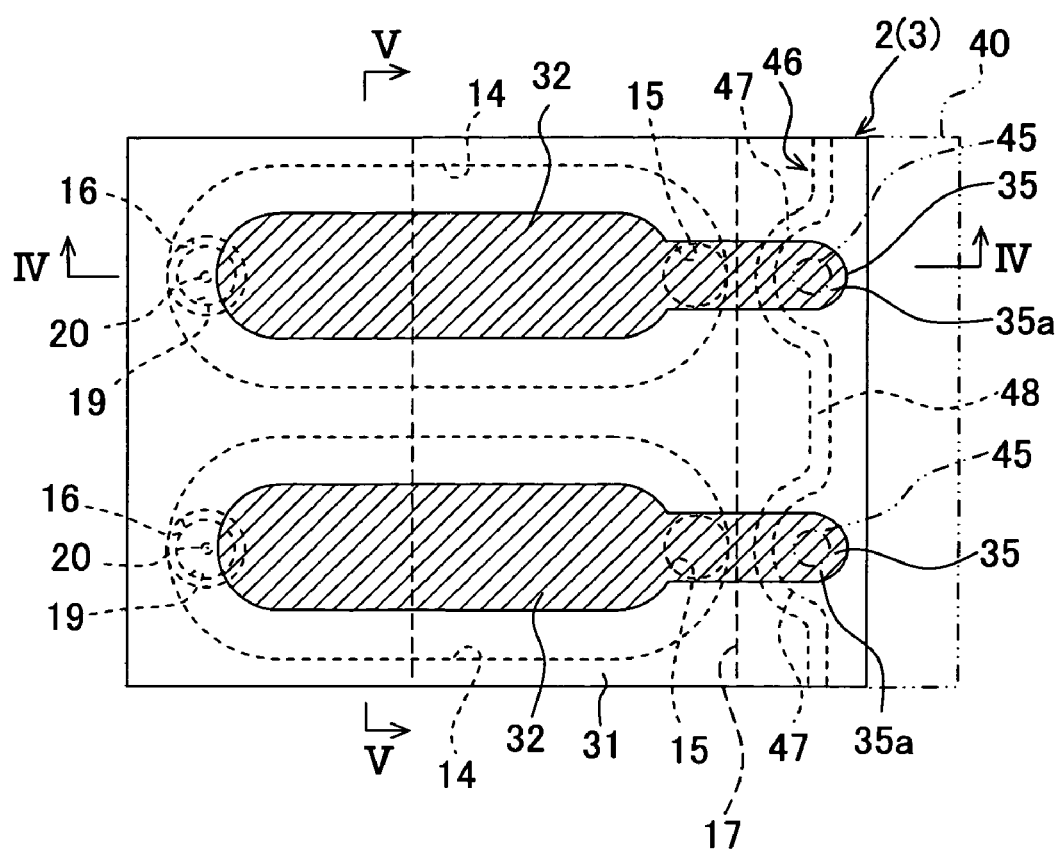
FIG. 3 is a partially enlarged view of FIG. 2.

As shown in FIGS. 3 and 4, communication holes 15 and 16 are formed in the base plate 11 at positions which overlap, in a plan view, with both end portions respectively in the long axis direction of each of the pressure chambers 14. In addition, in the manifold plate 12, a manifold 17, which is extended in two rows in the paper feeding direction (up and down direction in FIG. 2) such that the manifold 17 overlaps in a plan view with a left half of each of the pressure chambers 14 aligned in the left side and or a right half of each of the pressure chambers 14 aligned in the right side. An ink supply port 18, which is formed in the vibration plate 30 (to be explained later), is connected to the manifold 17, and ink is supplied to the manifold 17 from an ink tank (not shown in the diagram) via the ink supply port 18. Further, communication holes 19 communicating to the communication holes 16 respectively are formed at positions each of which overlaps in a plan view with an end portion on a side of each of the pressure chambers 14, the side being opposite to the manifold 17. Furthermore, nozzles 20 are formed in the nozzle plate 13 at positions each of which overlaps in a plan view with one of the communication holes 19. These nozzles are formed by performing eximer laser processing to a substrate formed of a high-molecular synthetic resin material such as polyimide.

As shown in FIG. 4, the manifold 17 communicates with each of the pressure chambers 14 via one of the communication holes 15, and each of the pressure chambers 14 communicates with one of the nozzles 20 via the communication holes 16 and 19. Thus, a plurality of individual ink channels 21 each of which extends from the manifold 17 to the nozzle 20 via the pressure chamber 14 is formed in the channel unit 2.

Next, the piezoelectric actuator 3 will be described. As shown in FIGS. 2 to 5, the piezoelectric actuator 3 includes a vibration plate 30, a piezoelectric layer 31, a plurality of individual electrodes 32, and a flexible printed circuit (FPC) board 40. The vibration plate 30 is arranged on the upper surface of the cavity plate 10. The piezoelectric layer 31 is formed on the upper surface (surface opposite to the pressure chambers 14) of the vibration plate 30. The individual electrodes 62 are formed on the upper surface of the piezoelectric layer 31 corresponding to the pressure chambers 14 respectively. The FPC 40 supplies drive voltage to the individual electrodes 32. In FIGS. 2 and 3, the FPC 40, which should be shown with solid lines, is shown with two-dot chain lines for a clear illustration. The cavity plate 10 of the channel unit 2 serves as a supporting member supporting the vibration plate 30 and also forms a part of the piezoelectric actuator 3. Each of the pressure chambers 14, which are formed through the cavity plate 10, serves as a non-interference portion which does not interfere with the deformation of the vibration plate 30 (the vibration plate 30 can deform into the non-interference portion). Each of the column portions 10a is joined to the vibration plate 30 and serves as a joining portion.

The vibration plate 30 is made of a metallic material such as an iron alloy like stainless steel, a copper alloy, a nickel alloy, a titanium alloy, or the like. The vibration plate 30 is arranged on the upper surface of the cavity plate 10 so as to cover the pressure chambers 14, and is joined to joining portions 10a of the cavity plate 10. The metallic vibration plate 30 is electrically conductive and is always kept at a ground potential. The vibration plate 30 also serves as a common electrode (first electrode) which generates an electric field in the piezoelectric layer 31 at portions sandwiched between the individual electrodes 32 and the vibration plate 30.

The piezoelectric layer 31, which is ferromagnetic and composed mainly of lead zirconate titanate (PZT) that is a solid solution of lead titanate and lead zirconate, is formed on the upper surface of the vibration plate 30. As shown in FIGS. 2 to 5, the piezoelectric layer 31 is formed on the upper side of the vibration plate 30 continuously over the pressure chambers 14.

On the upper surface of the piezoelectric layer 31, a plurality of individual electrodes (second electrodes) 32 each having a flat shape, substantially elliptical form, and smaller in size to some extent than the pressure chamber 14 are formed. Each of these individual electrodes 32 is formed at a position which overlaps in a plan view with a central portion of the corresponding pressure chamber 14. Namely, as shown in FIG. 2, the individual electrodes 32 are formed to align in two rows in the paper feeding direction (up and down direction in FIG. 2) corresponding to the pressure chambers 14 respectively. The individual electrodes 32 are made of an electro-conductive material such as gold, copper, silver, palladium, platinum, and titanium. Further, on the upper surface of the piezoelectric layer 31, a plurality of wirings 35 are formed. Each of the wirings 35 extends, from one end portion (end portion on the side of the manifold 17) of one of the individual electrodes 32, up to an area which faces one of the column portions 10a, and extends in parallel to the longitudinal direction (left and right direction in FIG. 2) of one of the individual electrodes 32.

The FPC 40 (wiring member) is arranged over the piezoelectric layer 31 and individual electrodes 32. The FPC 40 includes a substrate 41 which is flexible and formed of a synthetic resin such as polyimide and a plurality of terminals 42 which are formed on the lower surface (surface on the side of the piezoelectric layer 31) of the substrate 41, corresponding to the individual electrodes 32 respectively. As shown in FIG. 4, each of the wirings 42 has a terminal 42a arranged at an end thereof. The terminal 42a is joined to, via an electrically conductive material 45 composed of a solder, a conductive paste or the like, to a contact point 35a arranged at an end of one of the wirings 35 formed on the upper surface of the piezoelectric layer 31. In this case, the end of each of the wirings 35 is on its side that is opposite to the other end thereof nearer to the associated individual electrode 32. Further, the FPC 40 is connected to a driver IC (not shown) as a drive circuit. Namely, the driver IC and the wirings 35 are electrically connected by the FPC 40, and the drive voltage is supplied from the driver IC selectively to the individual electrodes 32 via the FPC 40.

Next, an action of the actuator 3 at the time of ink discharge will be explained. When drive voltage is applied from the driver IC selectively to a desired individual electrode 32 among the individual electrodes 32, a potential difference is generated in the piezoelectric layer 31 at a portion disposed above the individual electrode 32 to which the drive voltage is applied and the vibration plate 30 which is below the piezoelectric actuator 31 and is held at ground potential as the common electrode. At this time, an electric field in a vertical direction is generated in the piezoelectric layer 31 at a drive portion sandwiched between the individual electrode 32 to which the drive voltage is supplied and the vibration plate 30. As the electric field is generated, the drive portion of the piezoelectric layer 31 is contracted in a horizontal direction which is perpendicular to the vertical direction that is a direction in which the piezoelectric layer is polarized. With the contraction of the drive portion of the piezoelectric layer 31, the vibration plate 30 is deformed to project toward the pressure chamber 14 because the vibration plate 30 is joined to the cavity plate 10 at the column portion 10a of the cavity plate 10. The deformation of the vibration plate 30 reduces the volume of the pressure chamber 14 to apply pressure to the ink in the pressure chamber, thereby discharging the ink droplet through a nozzle 20 communicating with this pressure chamber 14.

As will be stated later on, in the producing process of the piezoelectric actuator 3, the conductive material 45 such as solder or conductive paste is melt on the surface of the contact points 35a of the wirings 35, and the plurality of terminals 42a of the FPC 40 are joined to the plurality of contact points 35a of the wirings 35a respectively with the molten or melt conductive material 45. Since the wirings 35 are formed of a conductive material as in the case with the individual electrodes 32, the surfaces of the wirings 35 have a high wettability. Therefore, the conductive material 45 such as solder which is melt on the surface of the contact point 35a, easily flows to arrive at the individual electrode 32 along the wiring 35. If the conductive material 45 flows out up to the surface of the individual electrode 32, the conductive material 45 hinders the deformation of the piezoelectric layer 31 when the drive voltage is applied to the individual electrode 32, thereby preventing the normal operation of the piezoelectric actuator 3. There is also a fear that the molten conductive material 45 flows out from one individual electrode 32 to another electrode or electrodes 32 adjacent to this individual electrode in a direction in which the individual electrodes 32 are arranged (up and down direction in FIG. 3), which can result in causing a short circuit between the wirings 35 adjacent to each other.

Therefore, in the piezoelectric actuator 3 of this embodiment, a cooling channel 46 is formed in the upper surfaces of the column portions 10a in the vibration plate 10. The cooling channel 46 is formed to have a groove shape of which top side is closed by the vibration plate 30, and is capable of being filled with a cooling liquid 60 (see FIG. 6C) for cooling the molten conductive material 45. In other words, the top side of the groove-shaped cooling channel 46 is covered by the vibration plate 30, thereby forming a cavity or hollow space. As shown in FIGS. 2 and 3, the cooling channel 46 includes individual cooling passages 47 (which serve as liquid-filled portions) each of which extends in arc form from an area, which is disposed between one of the individual electrodes 32 and a contact point 35a associated to this wiring 35 and which faces the wiring 35, up to an area facing a portion between the contact point 35a of the wiring 35 and a contact point 35 of another wiring 35 adjacent to the wiring 35. In other words, each of the individual cooling passages 47 extends across one of the wirings 35 between the associated electrode 32 and contact point 35a, extending further up to areas at both sides (in the up and down directions respectively in FIG. 2) of the contact point 35a of the associated wiring 35, so as to surround this contact point 35a from the side of the associated individual electrode 32.

Each of the individual cooling passages 47, aligned in two rows in the left and right directions, corresponds to one of the plurality of individual electrodes 32 aligned in two rows in the paper feeding direction (up and down direction in FIG. 2). The individual cooling passages 47 are communicated with each other via communication passages 48 each of which extends in parallel with the feeding direction between adjacent individual cooling passages 47. In addition, the left and right rows of individual cooling passages 47 are communicated with each other via a communication passage 49 which extends in the scanning direction (left and right direction in FIG. 2) at an upper end area which does not face the pressure chambers 14 in FIG. 2. Thus, all of the individual cooling passages 47 of the cooling channel 46 are communicated with each other via the communication passages 48 and 49. Further, the both ends of the cooling channel 46 are extended downwardly in FIG. 2 to be connected to an inlet port 50 and outlet port 51, respectively, which are formed in the vibration plate 30. Accordingly, when the cooling liquid 60 is filled into the cooling channel 46 through the inlet port 50, the liquid 60 flows in sequence through the individual cooling passages 47 and is discharged through the outlet port 51.

When the terminals 42a of the FPC 40 and the contact points 35a of the wirings 35 are joined with the conductive material 45, the conductive material 45 is melted while making the cooling liquid 60 to flow through the cooling channel 46. Then, the conductive material 45, flowing out from the surface of each of the contact points 35a toward its surroundings, is cooled by the cooling liquid 60 flowing through each of the individual cooling passages 47. As the conductive material 45 is cooled, its viscosity is increased, so that the conductive material 45 cannot flow further. This suppresses the flowing of the conductive material 45 from the surface of the contact point 35a to its surroundings. The step of joining of the FPC 40 and the wirings 35 will be explained in more detail in the following description of the producing method.

Figure 6A:
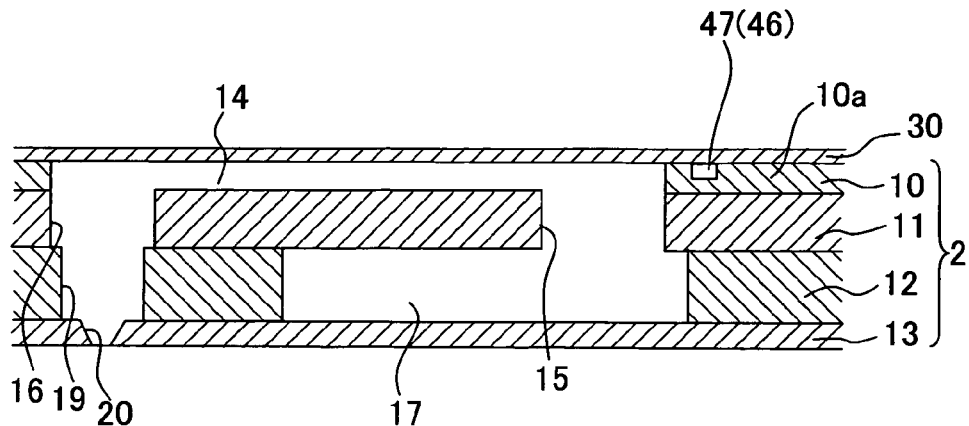

Next, a method for producing the ink-jet head 1 will be explained. First, the manifold 17 and the individual ink channels 21 each including a nozzle 20 and a pressure chamber 14 are formed by etching or the like through the four plates 10 to 13 constructing the channel unit 2. At the same time, the cooling channel 46 including the individual cooling passages 47 is formed in the column portions 10a of the cavity plate 10. Subsequently, as shown in FIG. 6A, the vibration plate 30 and the four plates 10 to 13 constructing the channel unit 2 are laminated together and subsequently joined together by means of joining with an adhesive, or by means of diffusion joining or the like.

Figure 6B:
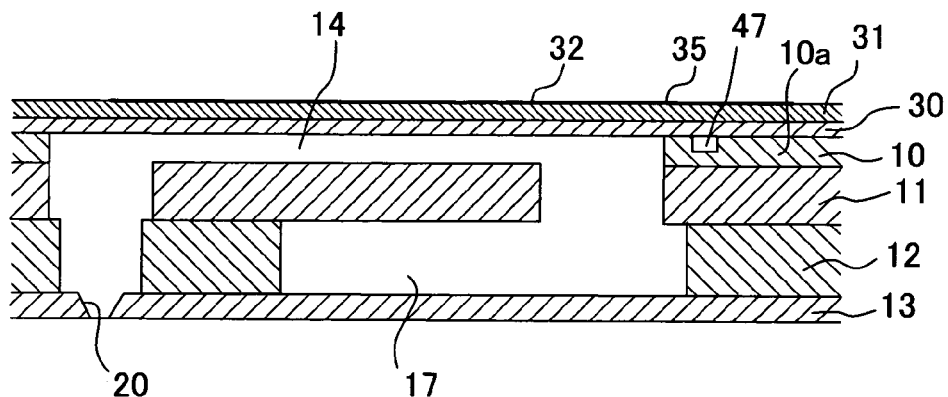

Next, as shown FIG. 6B, the piezoelectric layer 31 is formed on the upper surface of the vibration plate 30. The piezoelectric layer 31 can be formed by an aerosol deposition (AD) method in which very small particles of piezoelectric material are blown onto a substrate to be collided on the substrate at a high velocity and are deposited on the substrate. Alternatively, the piezoelectric layer 31 can be formed by a sputtering method, a chemical vapor deposition (CVD) method, a sol-gel method, a solution coating method or a hydrothermal synthesis method. Still alternatively, the piezoelectric layer 31 can be formed by joining or sticking, to the vibration plate 30, a piezoelectric sheet produced by calcining a green sheet of PZT. Subsequently, the individual electrodes 32 and the wirings 35 are formed on the upper surface of the piezoelectric layer 31 by screen printing or the like.

Figure 6C:
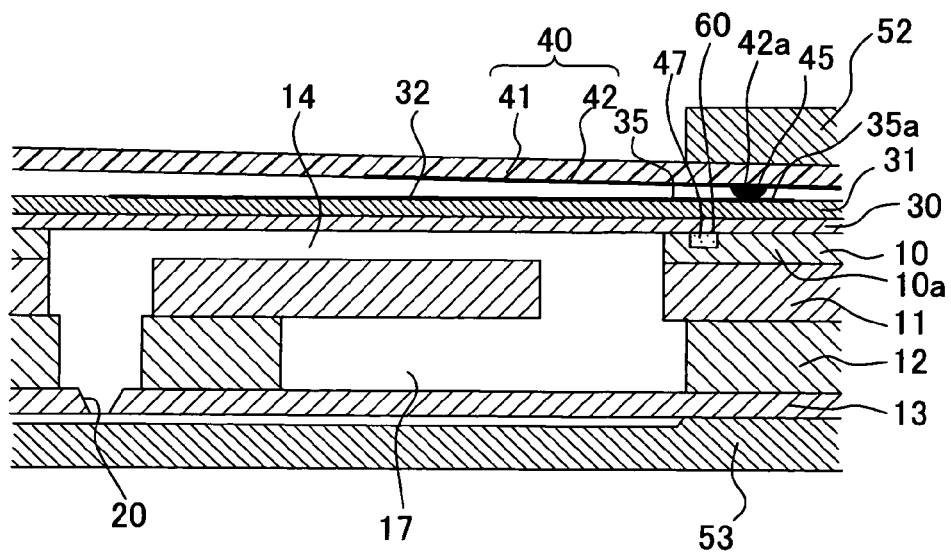

Next, a pressurizing device (not shown) such as a pump for pressurizing the cooling liquid 60 is connected to the inlet port 50. Subsequently, as shown in FIG. 6C, the cooling liquid 60 is poured (filled) by the pressuring device at normal temperature (for example, about 15° C.) under pressure into the cooling channel 46 (filling step). The individual cooling passages 47 of the cooling channel 46, each of which corresponds to one of the wirings 35 (contact points 35a), are all communicated with each other. Accordingly, the cooling liquid 60 filled through the inlet port 50 flows in sequence through the individual cooling passages 47 and is discharged through the outlet port 51. Consequently, the cooling liquid 60, filled continuously under pressure by the pressurizing device, is flowed forcibly and continuously through the cooling channel 46 (through the individual cooling passages 47). In this case, it is preferable to use, as the cooling liquid 60, a liquid mainly composed of water which is cheap and high in specific heat. The cooling liquid 60 may be ethylene glycol or an antifreeze mixture of water and ethylene glycol, or alternative flon such as hydrochlorofluorocarbon or hydrofluorocarbon.

Next, the FPC 40 is positioned over the piezoelectric layer 31 in a state in which the conductive material 45 such as solder or conductive paste is interposed between each of the terminal 42a of the FPC and each of the contact points 35a of the wirings 35. Subsequently, the conductive material 45 is heated to a preset melting temperature (for example, not less than 200° C.), so as to join the terminals 42a of the FPC to the contact points 35a of the wirings 35 respectively with the molten conductive material 45 (joining step). In this joining step, as shown in FIG. 6C for example, a pair of heat blocks 52, 53 is positioned on the upper side of the FPC 40 and under side of the nozzle plate 13, respectively. The FPC 40 and wirings 35 can be joined by pressing the FPC 40 toward the wirings 35 while melting the conductive material 45 by heating the conductive material 45 with the pair of heat blocks 52, 53. Alternatively, the FPC 40 and wirings 35 can be joined by pressing the FPC 40 toward the wirings 35 with a jig while irradiating the conductive material 45 with ion beam, infrared ray, laser beam or the like from above the FPC 40 to melt the conductive material 45.

At this time, a portion of the molten conductive material 45 attemps to flow out from the surfaces of the contact points 35a to their surroundings. However, the cooling liquid 60 is flowing continuously through the individual cooling passages 47, which are formed in each of the column portions 10a of the cavity plate 10 corresponding to one of the individual electrodes 32 (wirings 35). Each of the individual cooling passages 47 faces the associated wiring 35 between the associated electrode 32 and contact point 35a, and is formed to across this wiring 35. Accordingly, the low-temperature cooling liquid 60 flowing through each of the individual cooling passages 47 absorbs the heat from the high-temperature conductive material 45 flowing from the surface of the associated contact 35a along the associated wiring 35 toward the associated electrode 32. Consequently, the conductive material 45 is cooled quickly at an intermediate position of the wiring 35. As a result, the viscosity of the conductive material 45 is increased rapidly, so that the conductive material 45 starts to solidify, and thus does not flow further. Accordingly, it is possible to reliably prevent the conductive material 45 from sticking to the surface of the individual electrode 32, and thus to prevent reliably the adhered conductive material from inhibiting the deformation of the piezoelectric layer 31.

Each of the communication passages 48, communicating with the individual cooling passages 47 respectively, is formed between two contact points 35a of wirings 35 adjacent to each other in the direction in which the individual electrodes 32 are arrayed (up and down direction in FIG. 3). Accordingly, the conductive material 45, flowing from the surface of a contact point 35a of a certain wiring 35 toward a contact point or points 35a of another wiring or wirings 35 adjacent to this wiring 35, is cooled quickly by the low-temperature cooling liquid 60 flowing through a communication passage or passages 48 extending between the contact point 35a and the adjacent contact point or points 35a. Consequently, the conductive material 45 does not flow from the contact point 35a of a certain wiring 35 to another wiring or wirings 35 adjacent to the wiring 35, thereby preventing short circuit from occurring between adjacent wirings 35.

All of the individual cooling passages 47, each of which corresponds to one of the wirings 35, communicate with each other. The joining step is performed by melting the conductive material 45 while making the cooling liquid 60 to flow forcibly and continuously through the individual cooling passages 47. This further increases the cooling effect of the cooling liquid 60 on the conductive material 45, as compared with a case where no cooling liquid 60 is forced to flow. Accordingly, it is possible to reliably suppress the flowing of the conductive material 45 from the contact point 35a to its surroundings. In addition, since a liquid, mainly composed of water which is cheap and high in specific heat, is used as the cooling liquid 60, the molten conductive material 45 can be cooled effectively while lowering the manufacturing costs.

Next, modified embodiments in which various modifications are made to the first embodiment will be explained. Elements or components of the modified embodiments having the same configuration as those of the embodiment are given the same reference numerals and the descriptions therefor are omitted as appropriate.

FIRST MODIFIED EMBODIMENT

Figure 7:
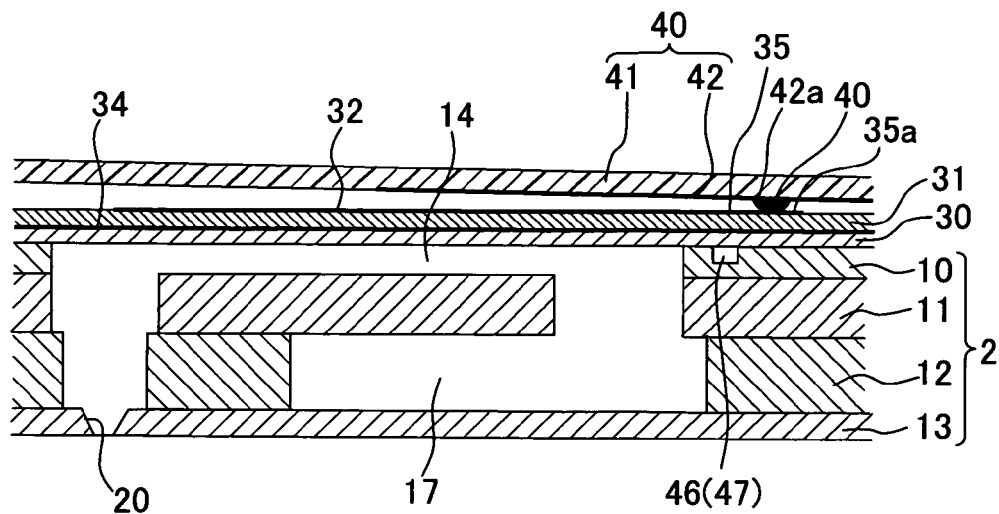
FIG. 7 is a sectional view of a first modified embodiment of the first embodiment, corresponding to FIG. 4.

It is not necessarily indispensable that the vibration plate 30 serves also as the common electrode. In a first modified embodiment of the first embodiment, as shown in FIG. 7, a common electrode 34 (first electrode) may be formed separately from the vibration plate 30. When the vibration plate 30 is metallic, however, the upper surface of the vibration plate 30, in which the common electrode 34 is to be formed, needs to be electrically insulative by forming an insulation layer or the like on the upper surface. When the vibration plate 30 is formed of a silicon material or the like, the upper surface of the vibration plate 30 may be electrically insulative by being oxidized. Alternatively, when the vibration plate 30 is formed of a ceramic material or an insulation material such as synthetic resin, the common electrode 34 is formed directly on the upper surface of the vibration plate 30.

SECOND MODIFIED EMBODIMENT

Figure 8:
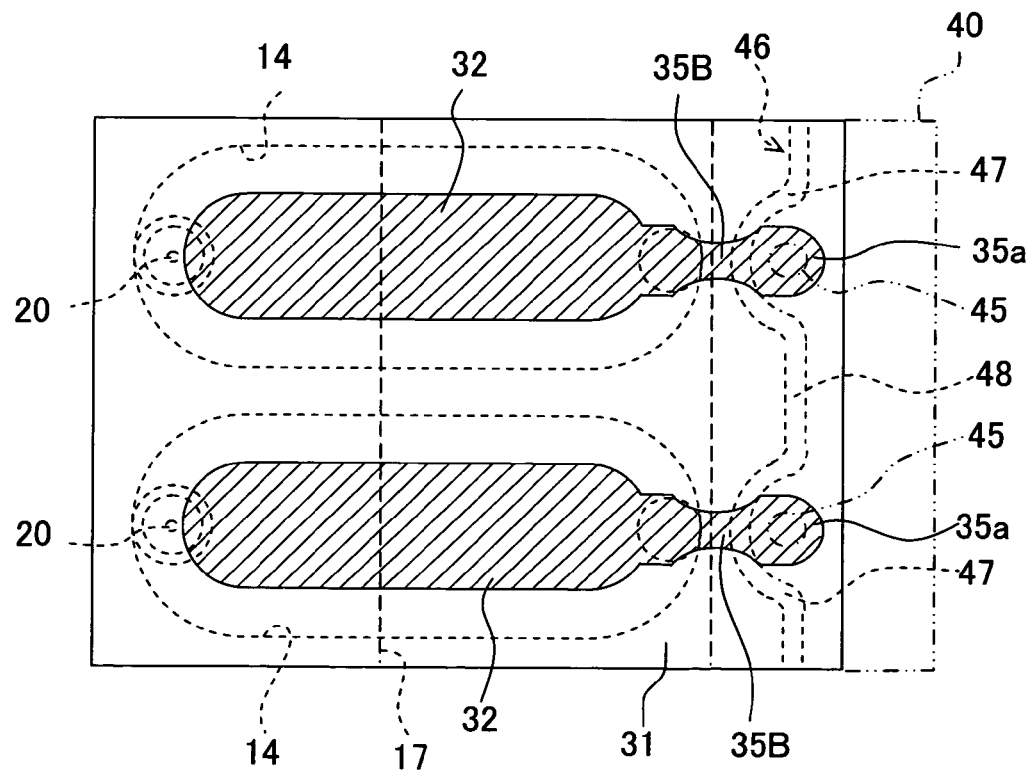
FIG. 8 is an enlarged plan view of a second modified embodiment of the first embodiment, corresponding to FIG. 3.

In a second modified embodiment of the first embodiment, as shown in FIG. 8, wirings 35B may be formed to be partially narrowed (to have a narrow-width portion) between each of the electrodes 32 and each of the contact points 35a. In this configuration, the amount of conductive material 45, which flows from each of the contact points 35a, along the associated wiring 35B having a high wettability, toward the associated electrode 32 becomes small. This prevents the conductive material 45 from sticking to the surfaces of the electrodes 32 more reliably.

THIRD MODIFIED EMBODIMENT

Figure 9:
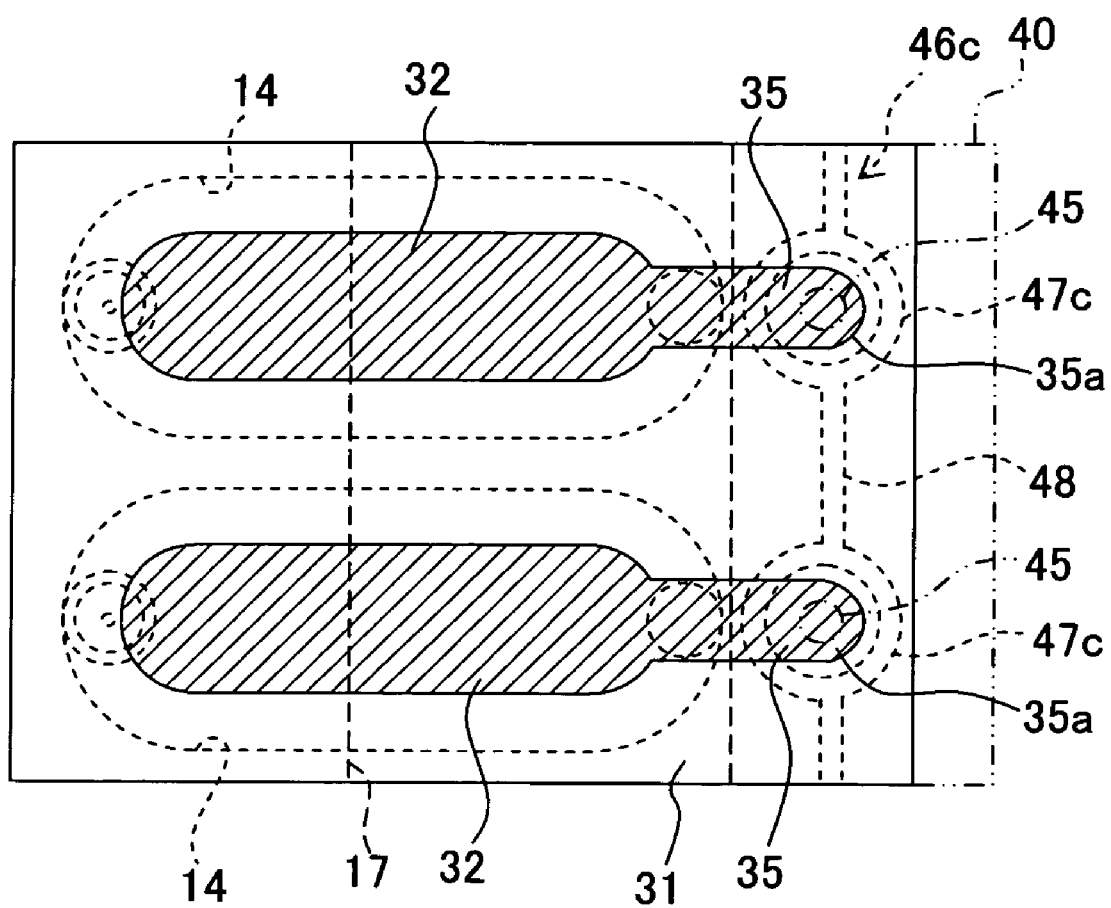
FIG. 9 is an enlarged plan view of a third modified embodiment of the first embodiment, corresponding to FIG. 3.

In a third modified embodiment of the first embodiment, as shown in FIG. 9, individual cooling passages 47C of a cooling channel 46C may be formed to have annular form to surround the contacts point 35 of each of the wirings 35 in a plan view. In this case, it is possible to prevent the conductive material 45 from flowing out from the contact points 35a to their surroundings more reliably.

FOURTH MODIFIED EMBODIMENT

Figure 10:
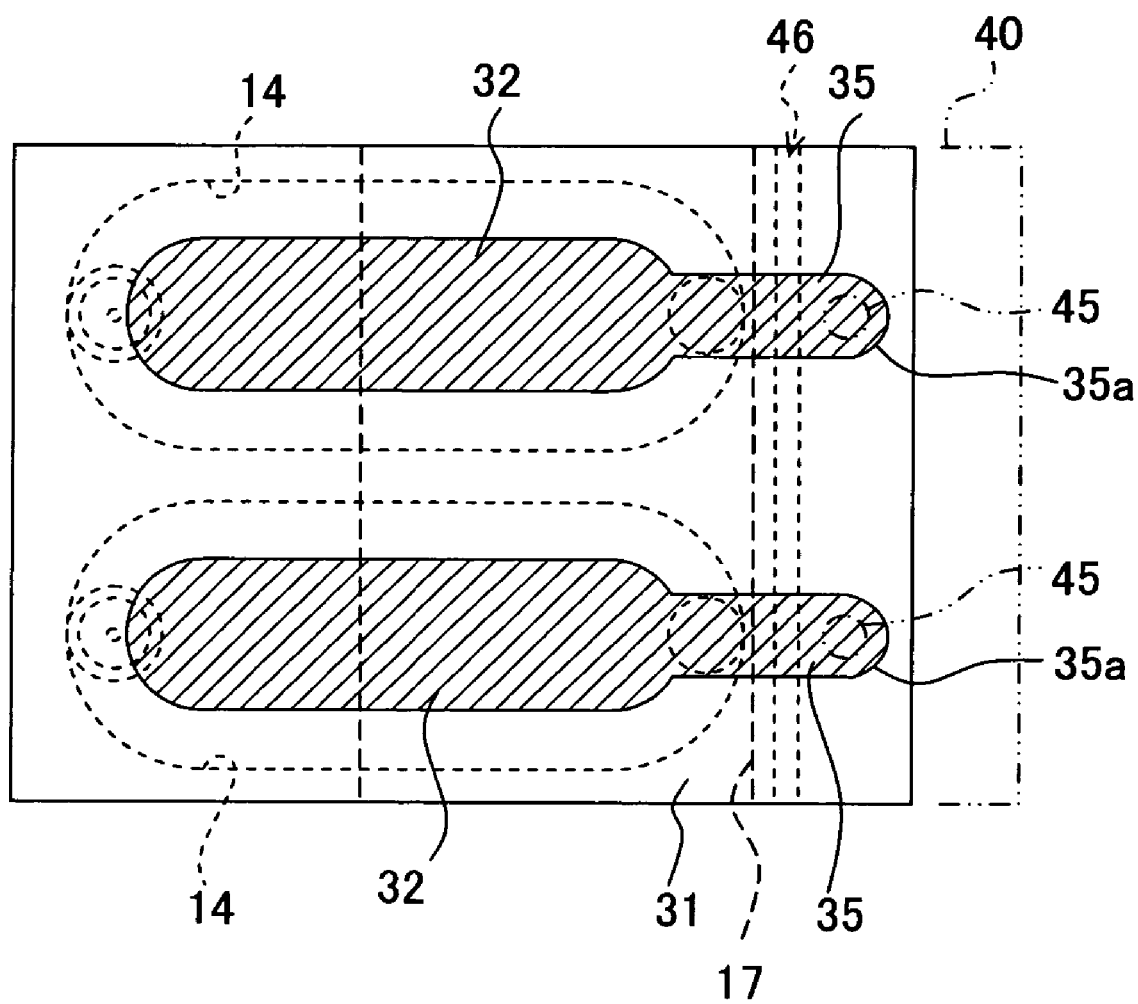
FIG. 10 is an enlarged plan view of a fourth modified embodiment of the first embodiment, corresponding to FIG. 3.

When there is little fear that the short circuit between two adjacent wirings 35 because, for example, the contact points 35a are spaced sufficiently from each other between two adjacent wirings 35, then it is not particularly necessary for the cooling channel to be formed extending up to an area or portion between the contact points 35a corresponding to these adjacent wirings 35, as in the case of the first embodiment. In such a case, a structure is sufficient which can prevent mainly the conductive material 45 from flowing from the contact point 35a along the associated wiring 35 to the associated electrode 32. In a fourth modified embodiment of the first embodiment, as shown in FIG. 10 for example, a cooling channel 46D may be formed to extend across the wirings 35, between the individual electrodes 32 and the contact points 35a, in the directions in which the electrodes 32 are arrayed (up and down direction in FIG. 10).

FIFTH MODIFIED EMBODIMENT

Figure 11:
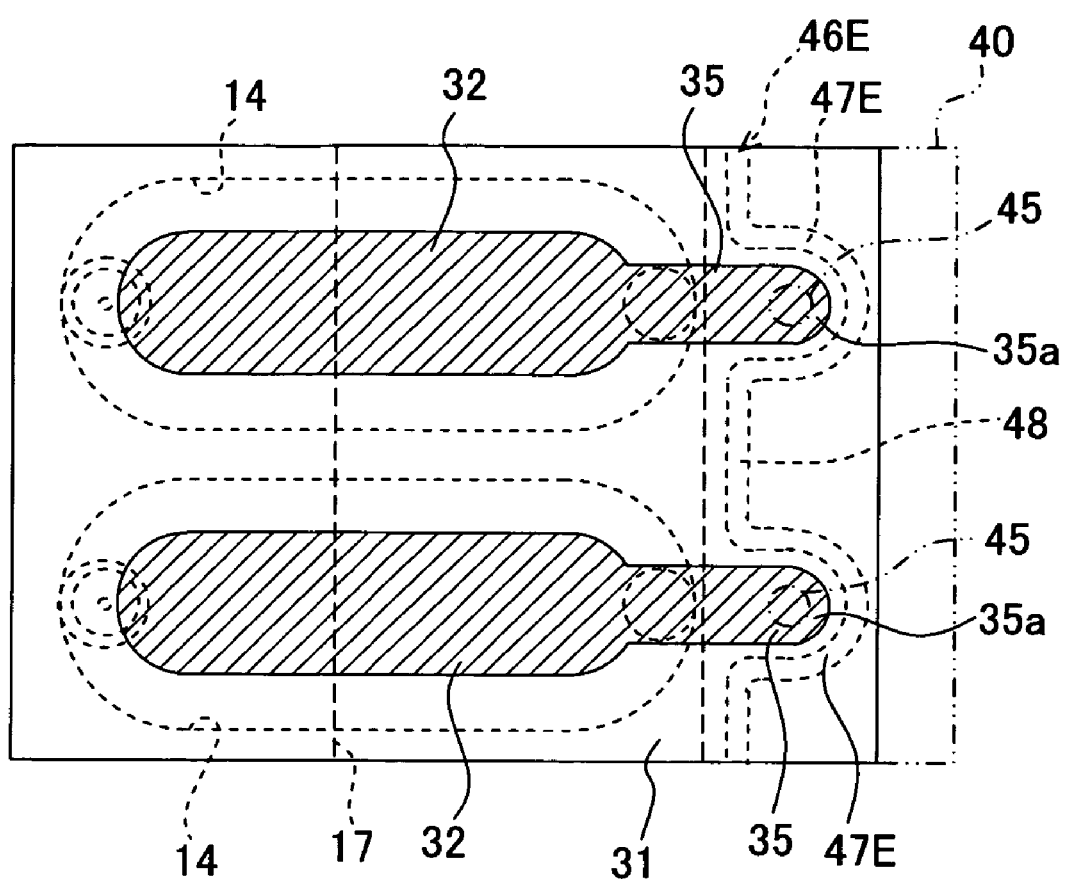
FIG. 11 is an enlarged plan view of a fifth modified embodiment of the first embodiment, corresponding to FIG. 3.

On the other hand, contrary to the above-described case, when there is little fear that the conductive material 45 flowing out of one of the wirings 35 is hardly reaches the associated individual electrode 32 because, for example, each of the wirings is long and each of the contact points 35a and each of the individual electrodes 35 are spaced sufficiently from each other, then it is not particularly necessary for the cooling channel to be formed in an area which is between the individual electrode 32 and the contact point 35a and which faces the wiring 35, as in the case of the first embodiment. In such a case, a structure is sufficient which can reliably prevent the short circuit from occurring between adjacent contact points 35a. In a fifth modified embodiment of the first embodiment, as shown in FIG. 11, individual cooling passages 47E of a cooling channel 46E are not formed areas each of which is between one of the individual electrodes 32 and one of the contact points 35 and which faces one of the wirings 35. Rather, each of the individual cooling passages 47E extends at areas on both sides of one of the contact points 35a (namely, extends at areas between contact points 35a of two adjacent wirings 35), in parallel with one of the wirings 35, so as to surround the contact point 35a of one of the wirings 35 from a side opposite to a side of the associated individual electrode 32.

SIXTH MODIFIED EMBODIMENT

Figure 12:
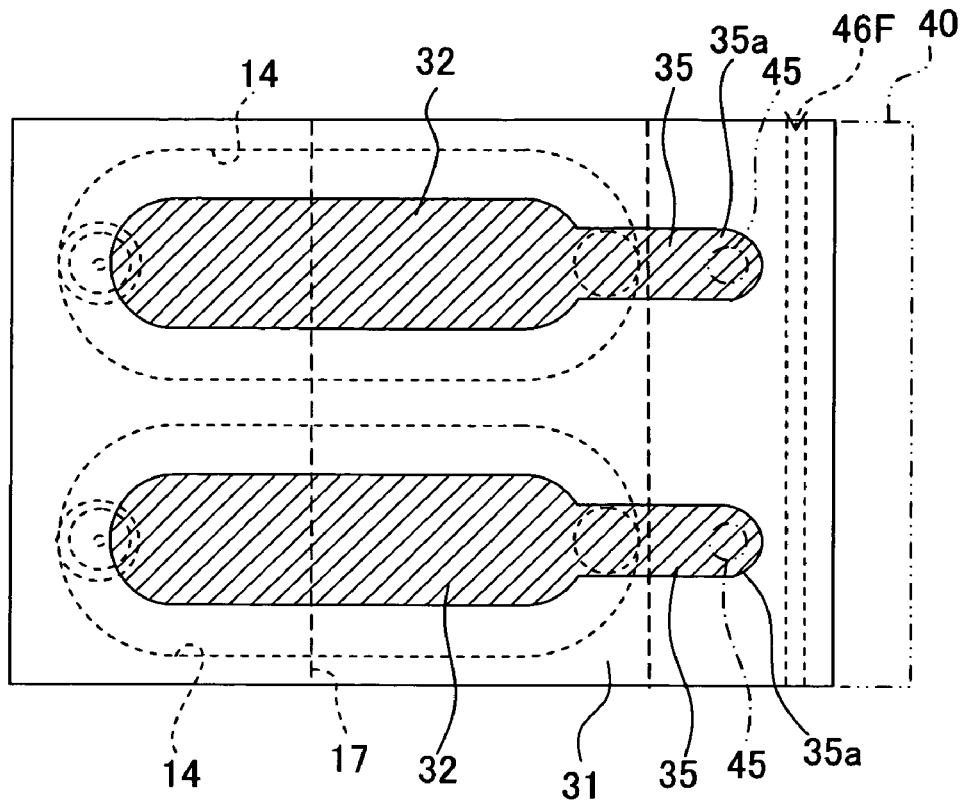
FIG. 12 is an enlarged plan view of a sixth modified embodiment of the first embodiment, corresponding to FIG. 3.

When it is necessary to prevent the conductive material 45 from flowing the contact points 35a of the wirings 35 in a direction opposite to (away from) the associated individual electrodes 32, in a sixth modified embodiment of the first embodiment, as shown in FIG. 12 for example, a cooling channel 46F may be formed to extend, on a side of the contact points 35a opposite to the individual electrodes 32, in the direction in which the electrodes 32 are arrayed (up and down direction in FIG. 12).

SEVENTH MODIFIED EMBODIMENT

Figure 13:
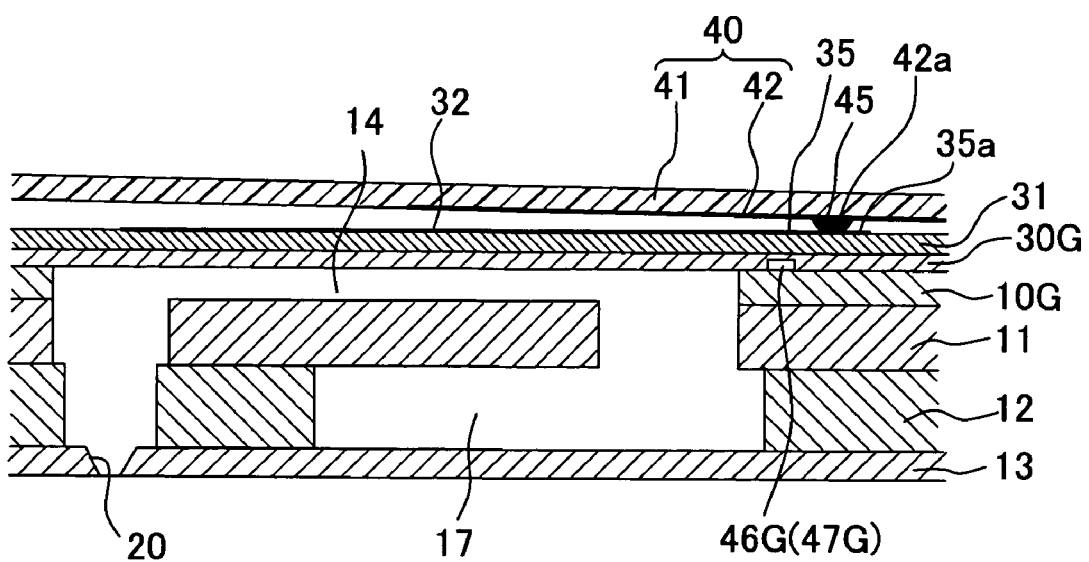
FIG. 13 is a sectional view of a seventh modified embodiment of the first embodiment, corresponding to FIG. 4.

It is not necessarily indispensable that the cooling channel be formed in the cavity plate. In a seventh modified embodiment of the first embodiment, as shown in FIG. 13, a cooling channel 46G (individual cooling passages 47G) is formed at an area of a vibration plate 30G, the area being joined to a cavity plate 10G. Alternatively, the cooling channel 46G may be formed across both of the vibration plate 30G and cavity plate 10G.

EIGHTH MODIFIED EMBODIMENT

Figure 14:
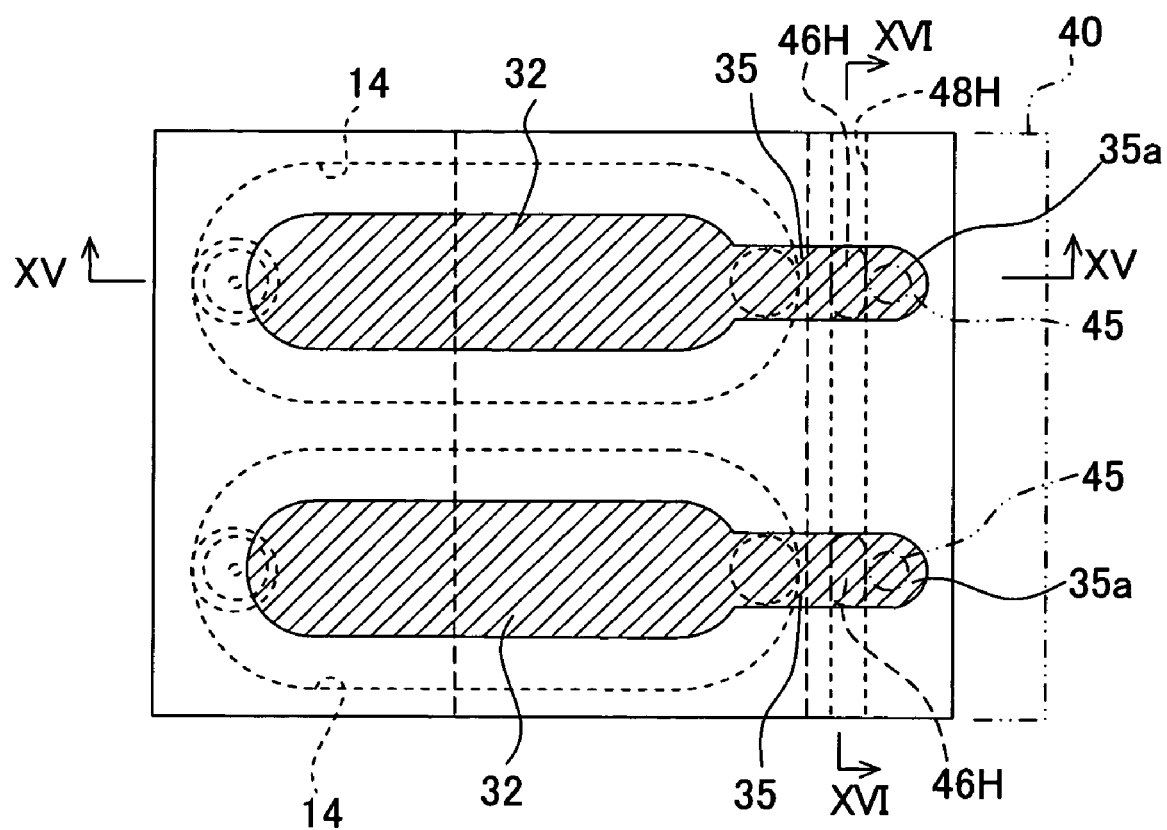
FIG. 14 is an enlarged plan view of an eighth modified embodiment of the first embodiment, corresponding to FIG. 3.
Figure 15:
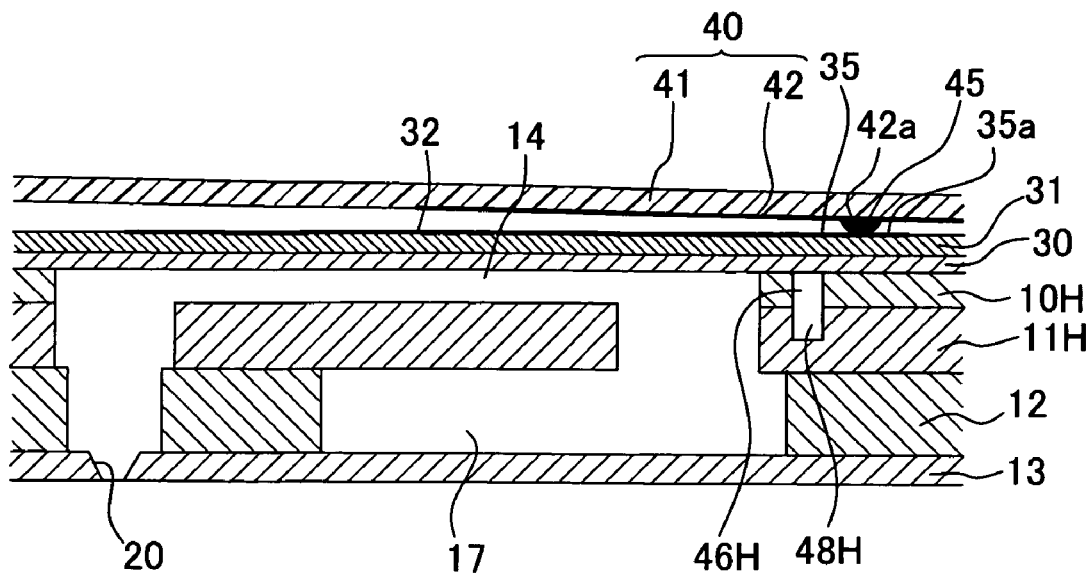
FIG. 15 is a sectional view taken on line XV-XV in FIG. 14.
Figure 16:
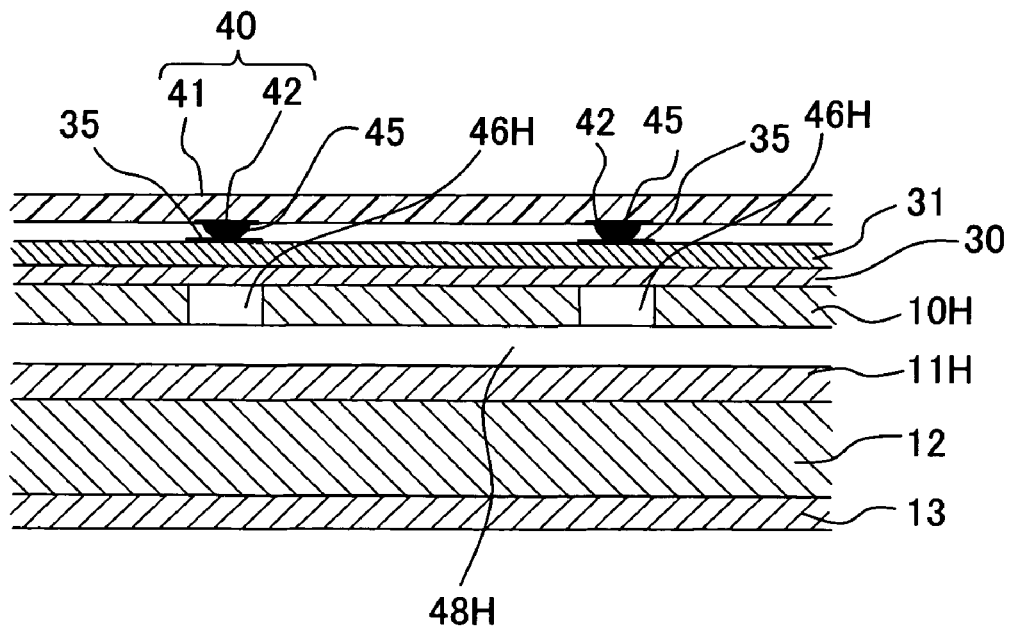
FIG. 16 is a sectional view taken on line XVI-XVI in FIG. 14.

In an eighth modified embodiment of the first embodiment, as shown in FIGS. 14 to 16, a plurality of liquid-filled portions 46H corresponding to a plurality of wirings 35 respectively may be formed in a cavity plate 10H, and a communication channel 48H, communicating these liquid-filled portions 46H with each other, may be formed in a base plate 11H disposed below the cavity plate 10H. Each of the liquid-filled portions 46H is a through hole formed to have a flat shape substantially elliptical which is long in the paper feeding direction (up and down direction in FIG. 14) in a plan view, and each of the liquid-filled portions 46H is formed at an area between one of the individual electrodes 32 and one of the contact points 35a and facing one of the wirings 35. The longitudinal direction of each of the liquid-filled portions 46H is substantially equal to the width of each of the wirings 35, and a short direction (width) of the liquid-filled portion 46H is substantially equal to the width of the communication channel 48H. Further, the communication channel 48H is formed by a groove or recess on the upper surface of the base plate 11H which extends in the paper feeding direction. When the terminals 42a of the FPC 40 and the contact points 35a of the wirings 35 are joined together, the conductive material 45 is heated and melt while making the cooling liquid 60 to flow continuously in the communication channel 48H so as to fill the cooling liquid 60 into the plurality of liquid-filled portions 46H through this communication channel 48. In the eighth modified embodiment also, the conductive material 45, which flows from the contact points 35a along the wrings 35 toward the individual electrodes 32 respectively, is cooled by the cooling liquid 60 filled in the liquid-filled portions 46H. Accordingly, it is possible to prevent the conductive material 45 from sticking to the surfaces of the individual electrodes 32.

n each of this embodiment and the modified embodiments, the cooling liquid 60 is used to cool the conductive materials 45. Instead of the cooling liquid 60, gas such as air, nitrogen, helium gas, flon gas, or coolant such as aerosol may be used. In such a case, by forcing the coolant flowing in a cavity or cavities such as the individual cooling passages 47 by a pressurizing device such as a pump, it is possible to efficiently cool the conductive material 45. When the air is used as the coolant, the air in the cavities can be made to flow by the air flow caused by convection, instead of using the pressurizing device. In this case, it is possible to omit the pressurizing device for filling the coolant under pressure into the cavities at the joining step, thereby simplifying the production equipment. Since the air is used as the coolant, it is unnecessary to provide a coolant separately, thus lowering the manufacturing cost.

Next, a second embodiment of the present invention will be described. An ink-jet head 71 according to the second embodiment is same as the first embodiment in construction except that the ink-jet head 71 has no cooling channel 46 (see FIGS. 2 to 4) for flowing the cooling liquid 60 therethrough. Accordingly, elements or components of the second embodiment having the same configuration as those of the first embodiment are given the same reference numerals and the descriptions therefor are omitted as appropriate.

Figure 17:
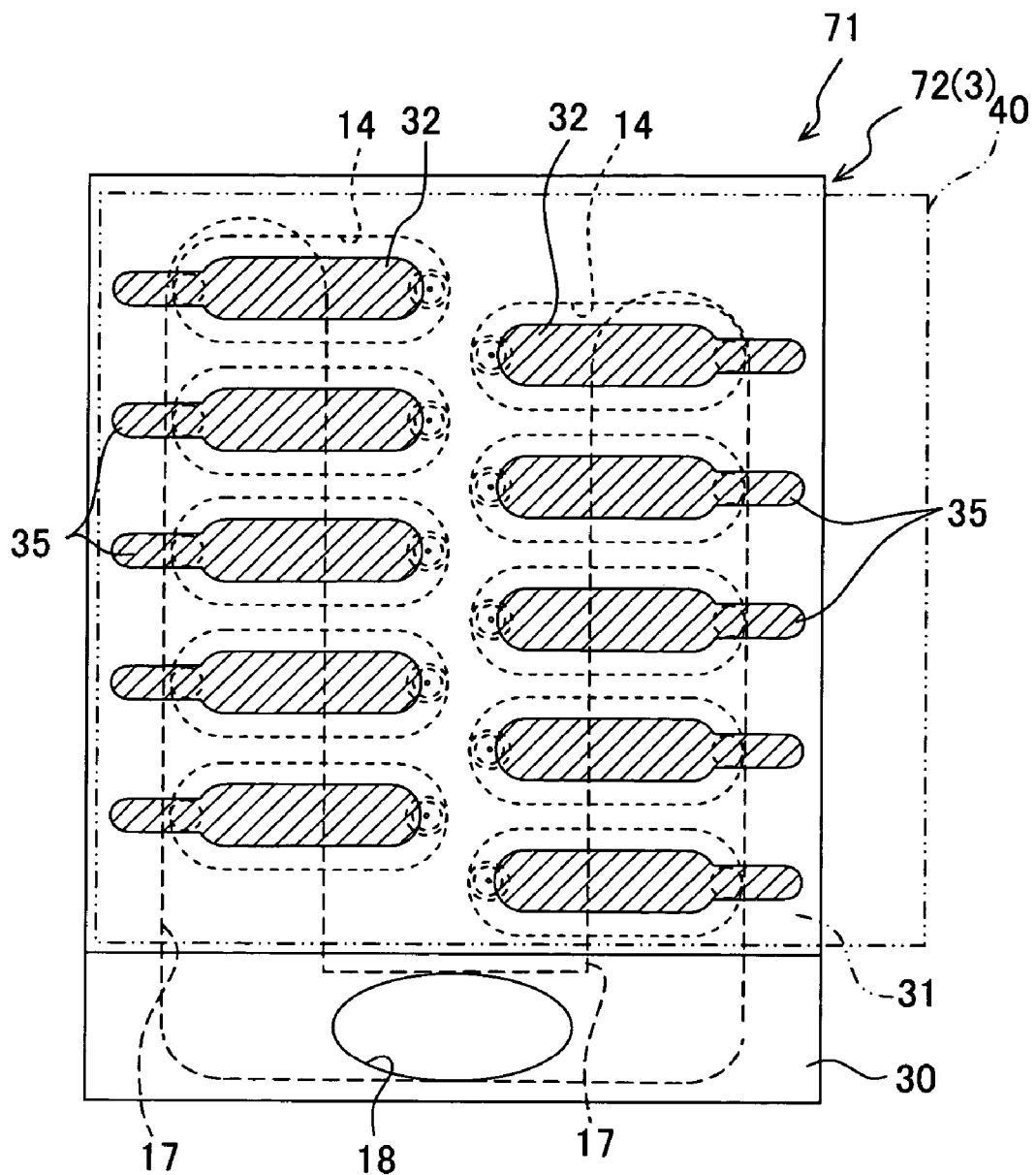
FIG. 17 is a plan view of an ink-jet head according to a second embodiment of the present invention.
Figure 18:
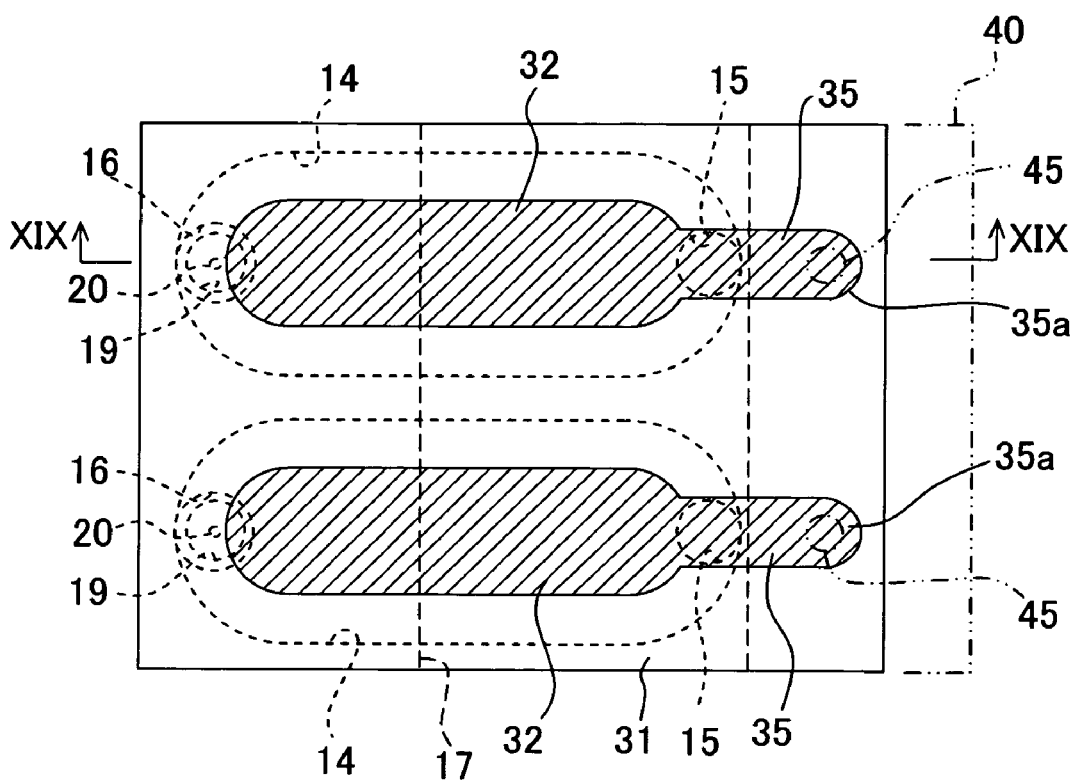
FIG. 18 is a partially enlarged view of FIG. 17.
Figure 19:
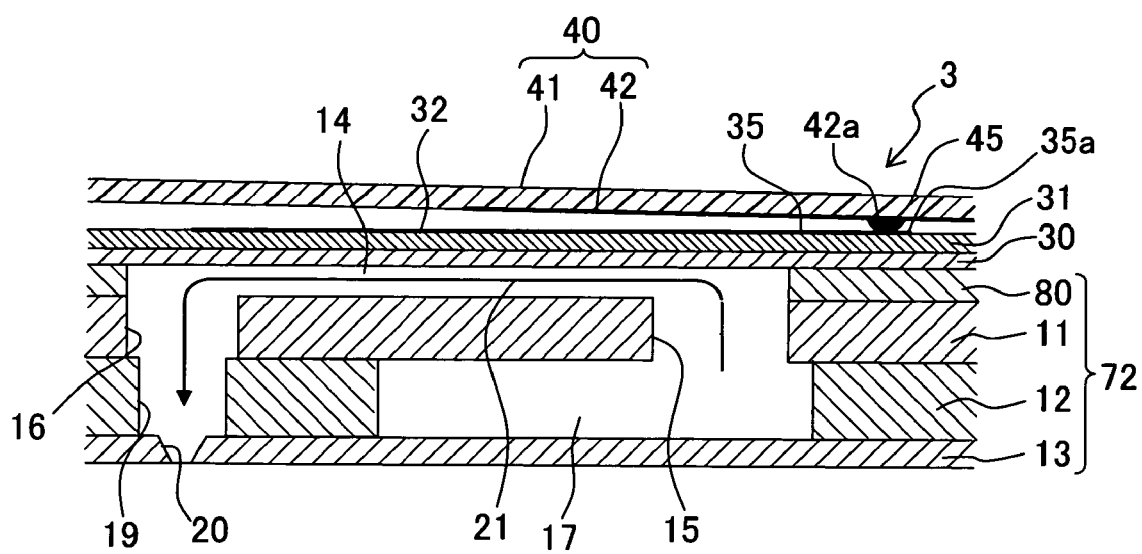
FIG. 19 is a sectional view taken on line XIX-XIX in FIG. 18.

As shown in FIGS. 17 to 19, the ink-jet head 71 of the second embodiment includes a channel unit 72 formed with an ink channel including a plurality of pressure chambers 14, and a piezoelectric actuator 3 arranged on the upper surface of the channel unit 72.

The channel unit 72 includes a cavity plate 80, a base plate 11, a manifold plate 12 and a nozzle plate 13, and these four plates are joined together in a state of stacked (laminated) layers. The cavity plate 80 has a plurality of pressure chambers 14 formed therein, and has a construction substantially similar to that of the cavity plate 10 of the first embodiment except that no cooling channel 46 (see FIGS. 2 to 4) is formed in the cavity plate 80. The base plate 11, manifold plate 12 and nozzle plate 13 are similar to those in the first embodiment and the explanation therefor will be omitted. The channel unit 72 has individual ink channels 21 formed therein, and each of the individual ink channels 21 extends from the manifold 17 through one of the pressure chambers 14 to the associated nozzle 20.

The piezoelectric actuator 3 is similar in structure to that of the first embodiment, and includes a vibration plate 30, a piezoelectric layer 31, a plurality of individual electrodes 32, a plurality of wirings 35 and an FPC 40 or the like. The wirings 35 are formed on the upper surface of the piezoelectric layer 31, and each of the wirings 35 has a contact point 35a. The FPC 40 has terminals 42a, each of which is joined to one of the contact points 35a of the wirings 35 with an electrically conductive material 45 such as solder.

Next, a method for producing the ink-jet head 71 of the second embodiment will be explained. The steps preceding the step of joining each of the terminals 42a of the FPC 40 and the associated contact point 35a are similar to those in the first embodiment (see FIGS. 6A and 6B). Therefore, the step of joining the FPC 40 and the wirings 35 will be described in particular.

Figure 20:
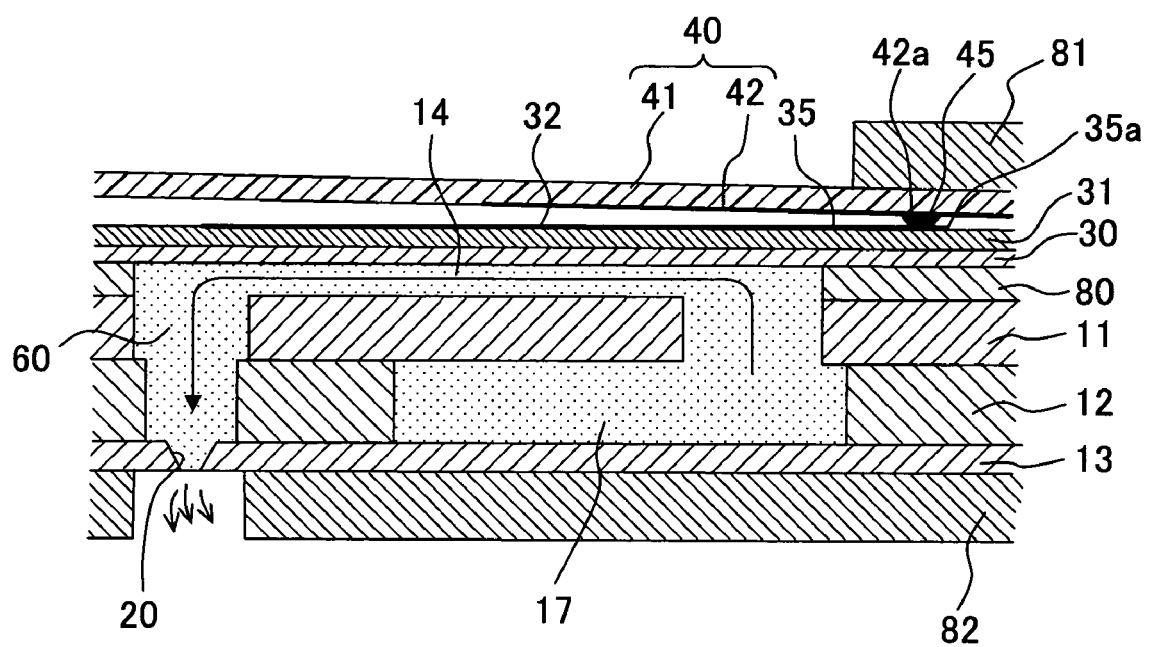
FIG. 20 shows a step of joining a wiring on the upper surface of a piezoelectric layer and a terminal of a FPC.

First, a pressurizing device such as a pump and the ink supply port 18 (see FIG. 17) are connected together. Then, as shown in FIG. 20, a cooling liquid 60 is filled by the pressurizing device at normal temperature (for example, about 15° C.) under pressure into the manifold 17 formed in the channel unit 72, and into the individual ink channels 21 each of which extends from the manifold 17 through the associated pressure chamber 14 to the associated nozzle 20 (filling step). The cooling liquid 60 is made to eject through the nozzles 20 so as to make the liquid 60 flow continuously through the individual ink channels 21.

With the cooling liquid 60 flowing through the individual ink channels 21, the FPC 40 is positioned over the piezoelectric layer 31, and the conductive material 45 such as solder or conductive paste is arranged between the terminals 42a of the FPC 40 and the contact points 35a of the wirings 35. Then, the conductive material 45 is heated to a preset melting temperature (for example, not less than 200° C.) to melt the conductive material 45 so as to join the terminals 42a of the FPC 40 and the contact points 35a of the wirings 35 with the molten conductive material 45 (joining step). In this case, as a heating method of the conductive material 45, as shown in FIG. 20, a method can be adopted in which the conductive material 45 is heated by using a pair of heater blocks 81, 82 which makes contact with the FPC 40 and nozzle plate 13, respectively. Alternatively, a various kinds of methods can be adopted in which ion beam, infrared ray or laser beam is radiated, or the like.

In this case, a portion of the conductive material 45 melt in the joining step attempts to flow out from the surface of the contact points 35a to their surroundings. However, the low-temperature cooling liquid 60 continuously flowing through the individual ink channels 21 absorbs the heat from the molten conductive material 45 to cool the conductive material 45. As a result, the viscosity of the conductive material 45 rises quickly, and thus the conductive material 45 starts to solidify. Accordingly, it is possible to suppress the conductive material 45 from flowing out from the contact points 35a to their surroundings. In this second embodiment, unlike in the first embodiment, the joining step is performed while making the cooling liquid 60 to flow through the ink channels such as the manifold 17 and the individual ink channels 21. Accordingly, there is no need to form, separately from the ink channels, a special channel (such as the cooling channel 46 of the first embodiment) for flowing the cooling liquid 60 therethrough. Consequently, this embodiment is advantageous in terms of manufacturing costs.

In the second embodiment, although the cooling liquid 60 is used as a coolant for cooling the conductive material 45, the coolant is not limited to liquid, and gas such as air, nitrogen, flon gas or helium, or a coolant such as aerosol may be used.

In each of the first and second embodiments, the joining step is performed with the cooling liquid 60 forced to flow continuously. Although it is preferable to force the cooling liquid 60 to flow in terms of cooling the conductive material 45 efficiently, the conductive material 45 can be cooled without forcing the cooling liquid 60 to flow. For example, in the first embodiment, the joining step may be performed with the outlet port 51 (see FIG. 2) of the cooling channel 46 closed, and with the channel 46 filled with the cooling liquid 60 (without the liquid 60 discharged outside) Likewise, in the second embodiment, the joining step may be performed with the nozzles 20 of the individual ink channels 21 closed, and with the channels 21 filled with the cooling liquid 60 (without the liquid 60 discharged outside). In each of these cases, although the cooling efficiency is low in comparison with the case where the cooling liquid 60 is forced to flow, there is no need for providing a pressurizing device or the like for filling the liquid 60 under pressure. This simplifies the manufacturing equipment.

Figure 21:
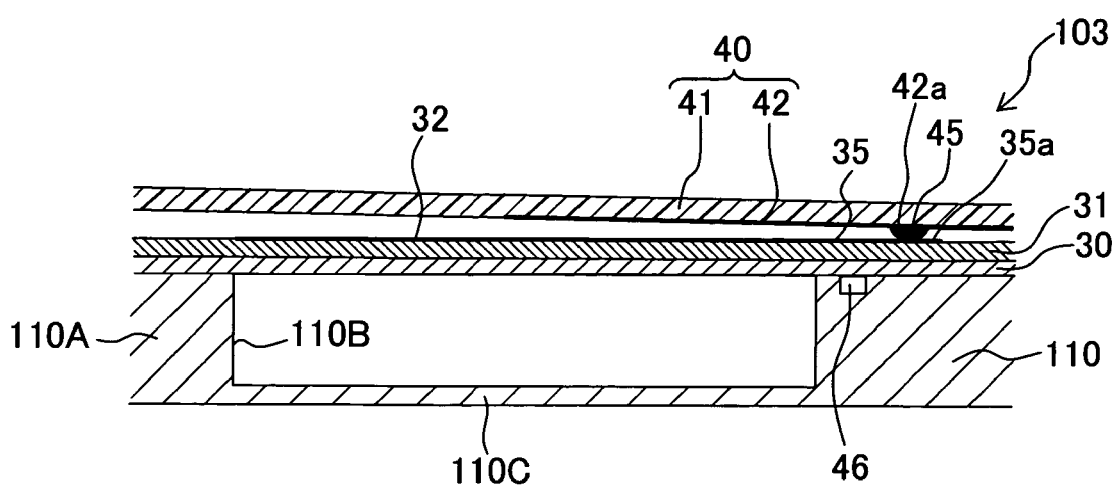
FIG. 21 is a sectional view of a piezoelectric actuator which includes a supporting member having a non-interference portion in the form of a groove, corresponding to FIG. 4.

The first and second embodiments have been explained hereinbefore as examples in which the present invention is applied to an ink-jet head. However, embodiments to which the present invention is applicable not limited to the first and second embodiments. The present invention can also be applied to various liquid transporting apparatuses which transport liquid other than ink. The actuators to which the present invention can be applied are not limited to actuators used to apply pressure on liquid. In other words, the present invention can be applied to actuators for other purposes when each of the actuators drives an object by deforming the vibration plate joined to the joining portion of a supporting member. In this case, it is not necessarily indispensable that the non-interference portions formed in the supporting member be holes or slots formed in the supporting member. It is sufficient that the non-interference portions have a shape that do not interfere the deformation of the vibration plate. As an example, FIG. 21 shows a piezoelectric actuator 103 which is similar to the ink-jet head shown in FIG. 4 except that the piezoelectric actuator 103 includes a supporting member 110 in place of the channel unit 2. The supporting member 110 has non-interference portions 110B having a shape of groove and formed in a surface of the supporting member 110 on the side of the vibration plate 30. Each of the non-interference portions 110B is formed in the surface of the supporting member 110B at an area overlapping in a plan view with one of the individual electrodes 32, is open toward the vibration plate 30, and is substantially same in shape with the individual electrode 32. The non-interference portions 110B are formed in the supporting member 110 in such a manner to form column portions 110A. Each of the column portions 110A of the supporting member 110 has a cooling channel 46 formed therein, and the cooling channel 46 is identical in shape with that of the first embodiment. The depth or height of each of the non-interference portions 110B is formed to be thinner than the thickness of the column portion 110A. The vibration plate 30 is driven to generate a pressure wave, thereby vibrating the bottom surfaces of the non-interference portions 110B. As shown in this example, the non-interference portion may be a concave portion formed in the supporting member.

What is claimed is:
1. A piezoelectric actuator comprising:
a vibration plate;
a supporting member having a non-interference portion which does not interfere with deformation of the vibration plate, and a joining portion joined to the vibration plate;
a piezoelectric layer arranged on a side of the vibration plate opposite to the supporting member;
a first electrode arranged on a surface of the piezoelectric layer on a side of the vibration plate;
a second electrode arranged at an area facing the non-interference portion, the area being on a surface of the piezoelectric layer on a side opposite to the vibration plate;
a wiring which has a contact point and which extends, on the surface of the piezoelectric layer on the side opposite to the vibration plate, from the second electrode to an area facing the joining portion; and
a wiring member which has a terminal joined, with an electrically conductive material, to the contact point of the wiring, and which supplies drive voltage to the second electrode;
wherein a cavity is provided at a portion of at least one of the vibration plate and the joining portion, the portion facing the wiring and being disposed between the second electrode and the contact point.

2. The piezoelectric actuator according to claim 1, wherein the cavity is a hole through which a coolant flows when the wiring and the terminal are joined with the conductive material.

3. The piezoelectric actuator according to claim 2, wherein the coolant is liquid.

4. The piezoelectric actuator according to claim 2, wherein the coolant is gas.

5. The piezoelectric actuator according to claim 3, wherein the non-interference portion is formed as a plurality of non-interference portions which are arranged adjacently to each other along a plane;
the second electrode is formed as a plurality of second electrodes corresponding to the non-interference portions respectively; and
the cavity is provided as a plurality of cavities which are communicated with each other and each of which corresponds to one of the second electrodes.

6. The piezoelectric actuator according to claim 5, wherein each of the cavities extends to an area facing a portion between contact points of wirings which correspond to second electrodes which are included in the plurality of second electrodes and which are adjacent to each other.

7. The piezoelectric actuator according to claim 3, wherein the cavity is formed to have an annular shape to surround the contact point of the wiring.

8. The piezoelectric actuator according to claim 3, wherein the wiring is partially narrowed at a portion thereof between the second electrode and the contact point.

9. A piezoelectric actuator comprising:
a vibration plate;
a supporting member having a plurality of non-interference portions which do not interfere with deformation of the vibration plate, and joining portions joined to the vibration plate;
a piezoelectric layer arranged on a surface of the vibration plate on a side opposite to the supporting member;
a first electrode arranged on a surface of the piezoelectric layer on a side of the vibration plate;
a plurality of second electrodes each of which is arranged at an area facing one of the non-interference portions, the area being on the surface of the piezoelectric layer on the side opposite to the vibration plate;
a plurality of wirings each of which has a contact point and extends, on the surface of the piezoelectric layer on the side opposite to the vibration plate, from one of the second electrodes to an area facing one of the joining portions;
a wiring member which has a plurality of terminals and which supplies drive voltage to the second electrodes, each of the terminals being joined, with an electrically conductive material, to the contact point of one of the wirings;
wherein a plurality of cavities are provided at portions of at least one of the vibration plate and the joining portions, each of the portions facing a portion between contact points of wirings corresponding to second electrodes which are included in the plurality of second electrodes and which are adjacent to each other.

10. The piezoelectric actuator according to claim 9, wherein each of the cavities is a hole though which coolant flows when the wirings and the terminals are joined respectively with the conductive material.

11. The piezoelectric actuator according to claim 10, wherein the coolant is liquid.

12. The piezoelectric actuator according to claim 10, wherein the coolant is gas.

13. A liquid transporting apparatus including a liquid channel which has a plurality of pressure chambers arranged along a plane, and a piezoelectric actuator which changes volume of the pressure chambers to apply pressure to a liquid in the pressure chambers, wherein the piezoelectric actuator comprises:

a pressure chamber plate in which the pressure chambers are formed;

a vibration plate which is joined to the pressure chamber plate at joining portions of the pressure chamber plate to cover the pressure chambers;

a piezoelectric layer arranged on a side of the vibration plate opposite to the pressure chamber plate;

a common electrode arranged on a surface of the piezoelectric layer on a side of the vibration plate;

a plurality of individual electrodes each of which is arranged at an area on a surface of the piezoelectric layer on a side opposite to the vibration plate, the area facing one of the pressure chambers;

a plurality of wirings each of which has a contact point and each of which extends, on the surface of the piezoelectric layer on the side opposite to the vibration plate, to an area facing one of the joining portions;

a wiring member which supplies drive voltage to the individual electrodes and which has a plurality of terminals, each of the terminals being joined to the contact point of one of the wirings with an electrically conductive material;

wherein cavities are provided at portions of at least one of the vibration plate and the joining portions, each of the portions facing one of the wirings and being disposed between one of the individual electrodes and the contact point of one of the wirings.

14. The liquid transporting apparatus according to claim 13, wherein each of the cavities is a hole through which coolant flows when the wirings and the terminals are joined respectively with the conductive material.

15. The liquid transporting apparatus according to claim 14, wherein the coolant is liquid.

16. The liquid transporting apparatus according to claim 14, wherein the coolant is gas.

17. A method for producing the piezoelectric actuator as defined in claim 3, the method comprising:

a filling step of filling cooling liquid into the cavity; and a joining step of heating the conductive material, and joining the wiring and the terminal with the molten conductive material.

18. The method according to claim 17, wherein the cooling liquid is mainly composed of water.

19. The method according to claim 17, wherein in the filling step, the cooling liquid filled into the cavity is forcibly flowed.

* * * * *